: US006214518B1

United States Patent
Kunita et al.

(10) Patent No.: US 6,214,518 B1
(45) Date of Patent: Apr. 10, 2001

(54) NEGATIVE TYPE IMAGE RECORDING MATERIAL AND METHOD OF PLATE-MAKING USING THE SAME

(75) Inventors: Kazuto Kunita; Keitaro Aoshima, both of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/350,917

(22) Filed: Jul. 12, 1999

(30) Foreign Application Priority Data

Jul. 17, 1998 (JP) .................................................. 10-203925

(51) Int. Cl.⁷ ..................................................... G03C 1/76
(52) U.S. Cl. ........................................ 430/270.1; 430/302
(58) Field of Search ................................. 430/270.1, 302

(56) References Cited

U.S. PATENT DOCUMENTS

| 5,932,392 | * | 8/1999 | Hirai et al. | 430/270.1 |
| 5,948,590 | * | 9/1999 | Aoshima | 430/270.1 |
| 6,083,658 | * | 7/2000 | Kunita et al. | 430/270.1 |

FOREIGN PATENT DOCUMENTS

| 780 239 | * | 6/1997 | (EP) . |
| 874 282 | * | 10/1998 | (EP) . |
| 10-16423 | * | 1/1998 | (JP) . |
| 10-282654 | * | 10/1998 | (JP) . |
| 10-282663 | * | 10/1998 | (JP) . |
| 11-84654 | * | 3/1999 | (JP) . |
| 11-102071 | * | 4/1999 | (JP) . |

\* cited by examiner

Primary Examiner—Janet Baxter
Assistant Examiner—Barbara Gilmore
(74) Attorney, Agent, or Firm—Burns, Doane, Swecker & Mathis, LLP

(57) ABSTRACT

There is provided a negative type image recording material that allows direct-plate making from digital data using an infrared laser and a method of plate-making using this negative type image recording material. The negative type image recording material comprises a compound (A) which is cross-linked with the aid of an acid, a binder polymer (B), a compound (C) which generates an acid upon heating, and (D) an infrared ray absorbing agent. The compound (A) which is cross-linked with the aid of an acid is a mixture of a lower molecular weight phenol derivative represented by the following general formula (I) with a polynuclear phenol cross-linking agent and/or resol resin. In the formula, $Ar^1$ represents an aromatic hydrocarbon ring, $R^1$, $R^2$ and $R^3$ represent a hydrogen atom or a hydrocarbon group having 12 or less carbon atoms, respectively, m represents an integer of 2 to 4, and n represents an integer of 1 to 3. X represents a divalent connecting group, Y represents a monovalent, divalent, trivalent or tetravalent connecting group or a functional group having a terminal hydrogen atom, manifesting interaction with a cross-linking agent having a specific structure.

General formula (I)

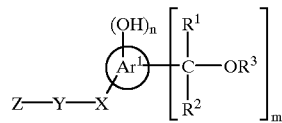

20 Claims, No Drawings

NEGATIVE TYPE IMAGE RECORDING MATERIAL AND METHOD OF PLATE-MAKING USING THE SAME

BACKGROUND OF THE INVENTION

1. Field of the Invention

The present invention relates to image recording materials which may be used as planographic printing plate materials, color proofs, photo resists or color filters. More particularly, the present invention relates to negative type image recording materials which can be used as planographic printing plate materials that allow direct plate-making by scanning infrared laser beams based on digital signals from a computer, and the like, and a method of plate making using this negative type image recording material.

2. Description of the Related Art

Recently, as recording light sources of a system for carrying out direct plate making from digital computer data, solid-state lasers and semiconductor lasers emitting infrared rays having wavelengths from 760 nm to 1200 nm have gathered attention since high output and compact lasers of this type are easily available. However, since many of the photosensitive recording materials that are useful in practice are sensitive to wavelengths in the visible range of 760 nm or less, images cannot be recorded with these infrared laser devices. Therefore, there is need formaterials capable of forming images with an infrared laser device.

As for image recording materials that can be used for recording with infrared laser devices, U.S. Pat. No. 4,708, 925 discloses recording materials containing an onium salt, a phenol resin, anda spectral sensitizer. However, these image recording materials are of a positive type and not of a negative type as in the present invention and make use of an effect of the onium salt and phenol resin to inhibit dissolution into a developing solution. On the other hand, negative type image recording materials are described, for example, in Japanese Patent Application Laid-Open (JP-A) No. 8-276558. These are recording materials composed of a substance that absorbs light and generates heat, an alkali-soluble resin, and a specific phenol derivative having in the molecule 4 to 8 benzene nuclei. However, though this image recording material can attain high printing durability when sufficient heating is conducted, it provides insufficient sensitivity during laser exposure since reactivity thereof is relatively low. There are various suggestions for increasing the sensitivity of these recording materials; however, means for improving sensitivity generally tended to decrease storage stability of the recording materials. In particular, storage stability in high humidity was problematical. Though it is known that high printing durability can be attained even when a resol resin is used as a cross-linking agent, there was a problem that it was poor in stability over time, like the above-described image recording materials.

SUMMARY OF THE INVENTION

Accordingly, an object of the present invention is to provide a negative type image recording material that allows direct plate making from digital data of a computer and the like by recording using a solid-state laser or semiconductor laser emitting infrared rays, and further reveals high sensitivity with respect to a laser, high printing durability, and excellent storage stability even under high humidity, and a method of plate making using this negative type image recording material.

The present inventors conducted extensive studies focusing on the constituent components of negative type image recording materials, and found that the above-described objects can be achieved by using as a cross-linking agent a mixture of a phenol derivative having a specific functional group, and a polynuclear phenol derivative having a specific structure and/or resol resin, thus completing the invention. Namely, in a first aspect, the present invention relates to a negative type image recording material comprising a compound (A) which is cross-linked with the aid of an acid, a binder polymer (B), a compound (C) which generates an acid upon heating, and an infrared ray absorbing agent (D), wherein the compound (A) which is cross-linked with the aid of an acid is a mixture of a lower molecular weight phenol derivative having a molecular weight of 1000 or less represented by the following general formula (I) with a polynuclear phenol cross-linking agent having in a molecule 3 or more phenol rings having 2 or 3 hydroxymethyl groups on a ring represented by the following general formula (II) and/or resol resin:

General formula (I)

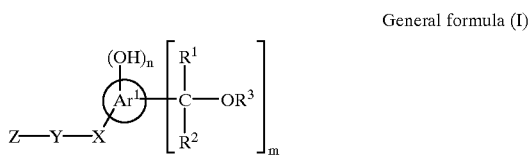

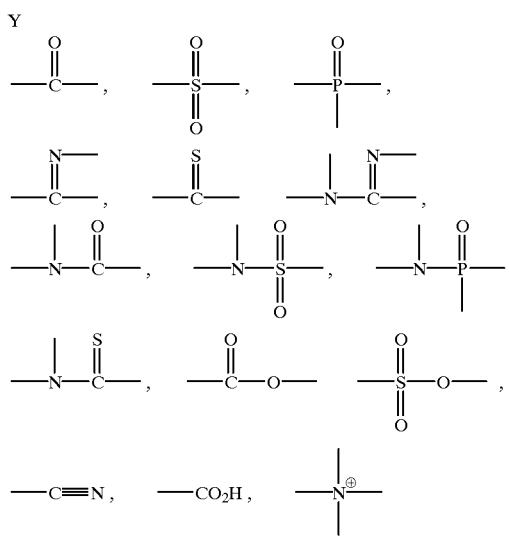

wherein, $Ar^1$ represents an aromatic hydrocarbon ring which may have a substituent; $R^1$ and $R^2$ may be the same or different, and represent a hydrogen atom or a hydrocarbon group having 12 or less carbon atoms; $R^3$ represents a hydrogen atom or a hydrocarbon group having 12 or less carbon atoms; m represents an integer of 2 to 4; n represents an integer of 1 to 3; X represents a divalent connecting group, Y represents a monovalent, divalent, trivalent or tetravalent connecting group having an above-described partial structure or a functional group having a terminal hydrogen atom, and Z does not exist when Y is a terminal group, or represents a monovalent, divalent, trivalent or tetravalent connecting group or functional group existing in accordance with the number of the connecting group Y;

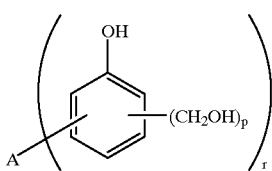

General formula (II)

wherein, A represents an r-valent hydrocarbon connecting group having 1 to 20 carbon atoms; r represents an integer of 3 to 20; and p represents an integer of 2 to 3.

In a second aspect, the present invention relates to a method of plate making in which a negative type image recording material comprising a substrate carrying thereon a layer comprising a compound (A) which is cross-linked with the aid of an acid, a binder polymer (B), a compound (C) which generates upon heating, and an infrared absorbing agent (D) is irradiated with an infrared laser beam having a wavelength of 760 nm to 1,200 nm to conduct direct plate making, wherein the compound (A) which is cross-linked with the aid of an acid is a mixture of a lower molecular weight phenol derivative having a molecular weight of 1000 or less represented by the following general formula (I) with a polynuclear phenol cross-linking agent having in a molecule 3 or more phenol rings having 2 or 3 hydroxymethyl groups on a ring represented by the following general formula (II) and/or resol resin:

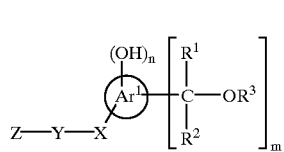

General formula (I)

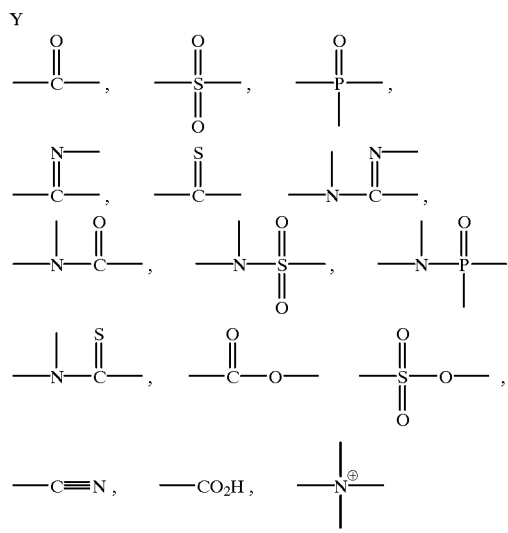

wherein, Ar¹ represents an aromatic hydrocarbon ring which may have a substituent; R¹ and R² may be the same or different, and represent a hydrogen atom or a hydrocarbon group having 12 or less carbon atoms; R³ represents a hydrogen atom or a hydrocarbon group having 12 or less carbon atoms; m represents an integer of 2 to 4; n represents an integer of 1 to 3; X represents a divalent connecting group, Y represents a monovalent, divalent, trivalent or tetravalent connecting group having the above partial structure or a functional group having a terminal hydrogen atom, and Z does not exist when Y is a terminal group, or represents a monovalent, divalent, trivalent or tetravalent connecting group or functional group existing in accordance with the number of the connecting group Y;

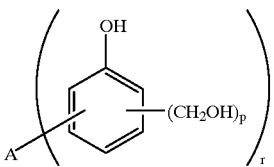

General formula (II)

wherein, A represents an r-valent hydrocarbon connecting group having 1 to 20 carbon atoms; r represents an integer of 3 to 20; and p represents an integer of 2 to 3.

DESCRIPTION OF THE PREFERRED EMBODIMENTS

The present invention will be described in detail below.

[(A) Compound which is cross-linked with the aid of an acid]

In the present invention, there is used as a compound which is cross-linked with the aid of an acid, a mixture of a phenol derivative represented by the above-described general formula (I) (hereinafter, referred to appropriately as a lower molecular weight phenol derivative) with a polynuclear phenol cross-linking agent having in a molecule 3 or more phenol rings having 2 or 3 hydroxymethyl groups on a ring represented by the above-described general formula (II) and/or resol resin.

The phenol derivative represented by the general formula (I) will be first described in detail.

In the general formula (I), Ar¹ represents an aromatic hydrocarbon ring which may have a substituent. A benzene ring, naphthalene ring or anthracene ring is preferable as the aromatic hydrocarbon ring in consideration of availability of raw materials. Examples of preferable substituents include a halogen atom, a hydrocarbon group having 12 or less carbon atoms, an alkoxy group having 12 or less carbon atoms, an alkylthio group having 12 or less carbon atoms, a cyano group, a nitro group, a trifluoromethyl group and the like. As Ar¹, a benzene ring or naphthalene ring without a substituent, or a halogen atom, a hydrocarbon group having 6 or less carbon atoms, an alkoxy group having 6 or less carbon atoms, an alkylthio group having 6 or less carbon atoms, a benzene ring and a naphthalene ring having as a substituent a nitro group or the like, are particularly preferable, because of high sensitivities thereof.

R¹ and R² may be the same or different, and represent a hydrogen atom or a hydrocarbon group having 12 or less carbon atoms. Each of R¹ and R² is preferably a hydrogen atom or a methyl group since synthesis thereof is easy. R³ represents a hydrogen atom or a hydrocarbon group having 12 or less carbon atoms. R³ is particularly preferably a hydrocarbon group having 7 or less carbon atoms such as a methyl group, ethyl group, propyl group, cyclohexyl group, benzyl group or the like, due to high sensitivities thereof. m represents an integer of 2 to 4. n represents an integer of 1 to 3.

X represents a divalent connecting group, Y represents a monovalent, divalent, trivalent or tetravalent connecting group having an above-described partial structure or a functional group having a terminal hydrogen atom, and Z does not exist when Y is a terminal group, or represents a monovalent, divalent, trivalent or tetravalent connecting group or functional group existing in accordance with the number of the connecting group Y.

X in the general formula (I) will be described in detail below.

X is a divalent connecting group, and represents a single bond or a hydrocarbon connecting group which may have a substituent. As the hydrocarbon connecting group, a normal chain alkylene group having 1 to 18 carbon atoms, a branched alkylene group having 1 to 18 carbon atoms and a cyclic alkylene group having 1 to 18 carbon atoms, a linear, branched or cyclic alkenylene group having 2 to 18 carbon atoms, analkynylene group having 2 to 8 carbon atoms and an arylene group having 6 to 20 carbon atoms are preferable. Specifically, more preferable examples thereof include methylene, ethylene, propylene, butylene, isopropylene, cyclohexylene, phenylene, tolylene, biphenylene, and groups having the following structures.

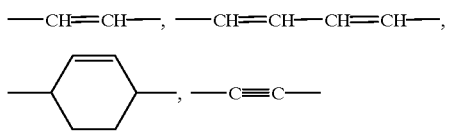

When these connecting groups have a substituent, an alkoxy group having 12 or less carbon atoms, a halogen atom, and a hydroxyl group are listed as examples of preferable substituents.

Y in the general formula (I) will be described in detail below.

In the general formula (I), Y is a functional group which may be a connecting group having Z, and may be monovalent, divalent, trivalent or tetravalent, and is particularly a group known to have strong mutual action with a phenolic hydroxy group. Specifically, functional groups having the following partial structures are exemplified.

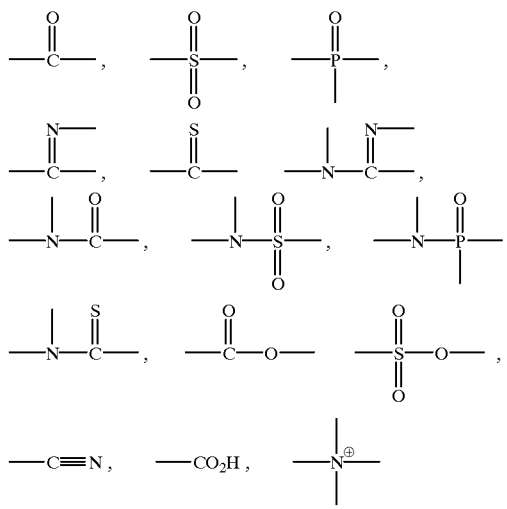

Here, that an exemplified structure is a partial structure of Y means that a functional group Y, which is a connecting group or has a terminal hydrogen atom, has at least one of the exemplified partial structures. Therefore, Y includes a group formed by connecting a plurality of the exemplified partial structures, a group formed by connecting an exemplified partial structure to an ordinary hydrocarbon atom and the like, as well as other groups.

Particularly preferable examples of the compounds having these functional groups include, specifically, amides, sulfonamides, imides, ureas, urethanes, thioureas, carboxylic acids, carboxylates, sulfonates and the like.

Z in the general formula (I) will be described in detail below.

Z does not exist when Y is a terminal group, or represents a monovalent, divalent, trivalent or tetravalent connecting group or functional group existing in accordance with the number of the connecting group Y. Z preferably represents a hydrocarbon connecting group or a group which may have a substituent, and as this hydrocarbon connecting group, the following are preferable: a normal chain alkylene group or alkyl group having 1 to 18 carbon atoms, a branched alkylene group or an alkyl group having 1 to 18 carbon atoms, cyclic alkylene group or alkyl group having 1 to 18 carbon atoms group, a arylene group or aryl group having 6 to 20 carbon atoms, a normal chain, branched or cyclic alkenylene group, or an alkenyl group having 2 to 18 carbon atoms, and an alkynylene or alkynyl group having 2 to 18 carbon atoms.

Preferable examples of Z, when Z is monovalent, include a methyl group, an ethyl group, a propyl group, an isopropyl group, a butyl group, an isobutyl group, a tertiary butyl group, a secondary butyl group, a pentyl group, a hexyl group, a cyclopentyl group, a cyclohexyl group, an octyl group, a benzyl group, a phenyl group, a naphthyl group, an anthracenyl group, an allyl group, a vinyl group and the like.

In a case in which Z is divalent or has a greater valency, a connecting group obtained by removing a hydrogen atom from these monovalent groups according to valencies thereof is preferable.

When Z has a substituent, preferable substituents include an alkoxy group having 12 or less carbon atoms, a halogen atom, and a hydroxyl group.

Specific examples of the lower molecular weight phenol derivative suitably used in the present invention are conveniently classified into several patterns, and for example, functional groups are exemplified below. However, these do not limit the scope of the present invention.

TABLE 1

(Type A)

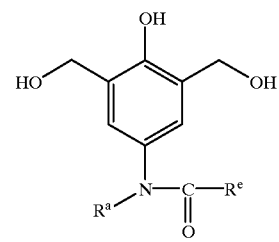

| | $R^a$ | $R^e$ |
|---|---|---|
| (A-1) | H | H |
| (A-2) | H | $CH_3$ |
| (A-3) | H | $C_2H_5$ |
| (A-4) | H | $^iPr$ |
| (A-5) | H | $^tBu$ |
| (A-6) | H | Ph |
| (A-7) | $CH_3$ | $CH_3$ |
| (A-8) | $CH_3$ | $^iPr$ |

TABLE 1-continued

(Type A)

[Structure: 4-hydroxy-3,5-bis(hydroxymethyl)phenyl group with N(Rᵃ)-C(=O)-Rᵉ substituent]

|        | Rᵃ  | Rᵉ  |
|--------|-----|-----|
| (A-9)  | CH₃ | Ph  |
| (A-10) | Ph  | CH₃ |
| (A-11) | Ph  | ⁱPr |

TABLE 2

(Type B)

[Structure: 4-hydroxy-3,5-bis(hydroxymethyl)phenyl group with -CH₂CH₂-N(Rᵃ)-C(=O)-Rᵉ substituent]

|       | Rᵃ | Rᵉ    |
|-------|----|----|
| (B-1) | H  | C₂H₅ |
| (B-2) | H  | ⁱPr  |
| (B-3) | H  | ⁿBu  |
| (B-4) | H  | ᵗBu  |
| (B-5) | H  | Ph   |

TABLE 3

(Type C)

[Structure: 4-hydroxy-3,5-bis(hydroxymethyl)phenyl group with -CH₂CH₂-NH-C(=O)-O-Rᶠ substituent]

|       | Rᶠ     |
|-------|--------|
| (C-1) | C₂H₅   |
| (C-2) | ⁱPr    |
| (C-3) | ⁿBu    |
| (C-4) | Ph     |
| (C-5) | CH₂Ph  |

TABLE 4

(Type D)

[Structure: 4-hydroxy-3,5-bis(hydroxymethyl)phenyl group with -CH₂CH₂-NH-C(=O)-N(Rᵍ)(Rʰ) substituent]

|       | Rᵍ  | Rʰ          |
|-------|-----|-------------|
| (D-1) | H   | ⁿBu         |
| (D-2) | H   | cyclo-C₆H₁₁ |
| (D-3) | H   | Ph          |
| (D-4) | H   | OCH₃        |
| (D-5) | H   | NO₂         |
| (D-6) | CH₃ | CH₃         |

TABLE 5

(Type E)

[Structure: 4-hydroxy-3,5-bis(hydroxymethyl)phenyl group with -CH₂CH₂-NH-S(=O)₂-Rⁱ substituent]

|       | Rⁱ |
|-------|-----|
| (E-1) | C₂H₅ |
| (E-2) | Ph |
| (E-3) | [4-methylphenyl (p-tolyl)] |
| (E-4) | [1-naphthyl] |

TABLE 6
(Type F)
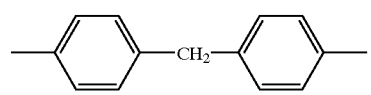
| | $R^j$ |
|---|---|
| (F-1) | $CH_2CH=CH_2$ |
| (F-2) | $^nBu$ |
| (F-3) | Ph |
TABLE 7
(Type G)
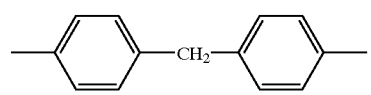
| | $Z^a$ |
|---|---|
| (G-1) | $-(CH_2)_4-$ |
| (G-2) | 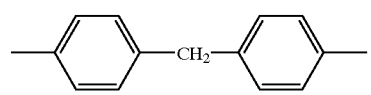 |
| (G-3) | 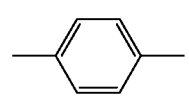 |
| (G-4) | $-NH(CH_2)_6NH-$ |
| (G-5) | 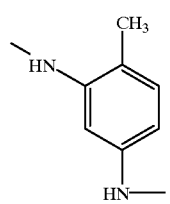 |
| (G-6) | 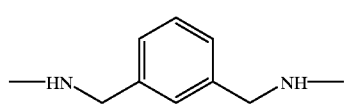 |
TABLE 7-continued
(Type G)
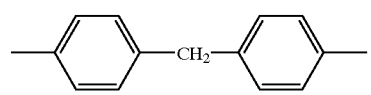
| | $Z^a$ |
|---|---|
| (G-7) | $-O(CH_2)_6O-$ |
| (G-8) | 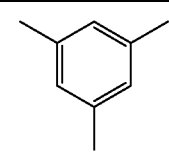 |
TABLE 8
(Type H)
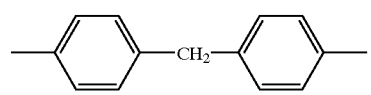
| | $Z^b$ |
|---|---|
| (H-1) | 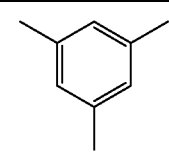 |
| (H-2) | 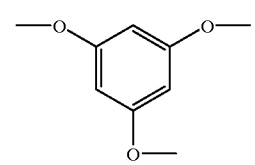 |

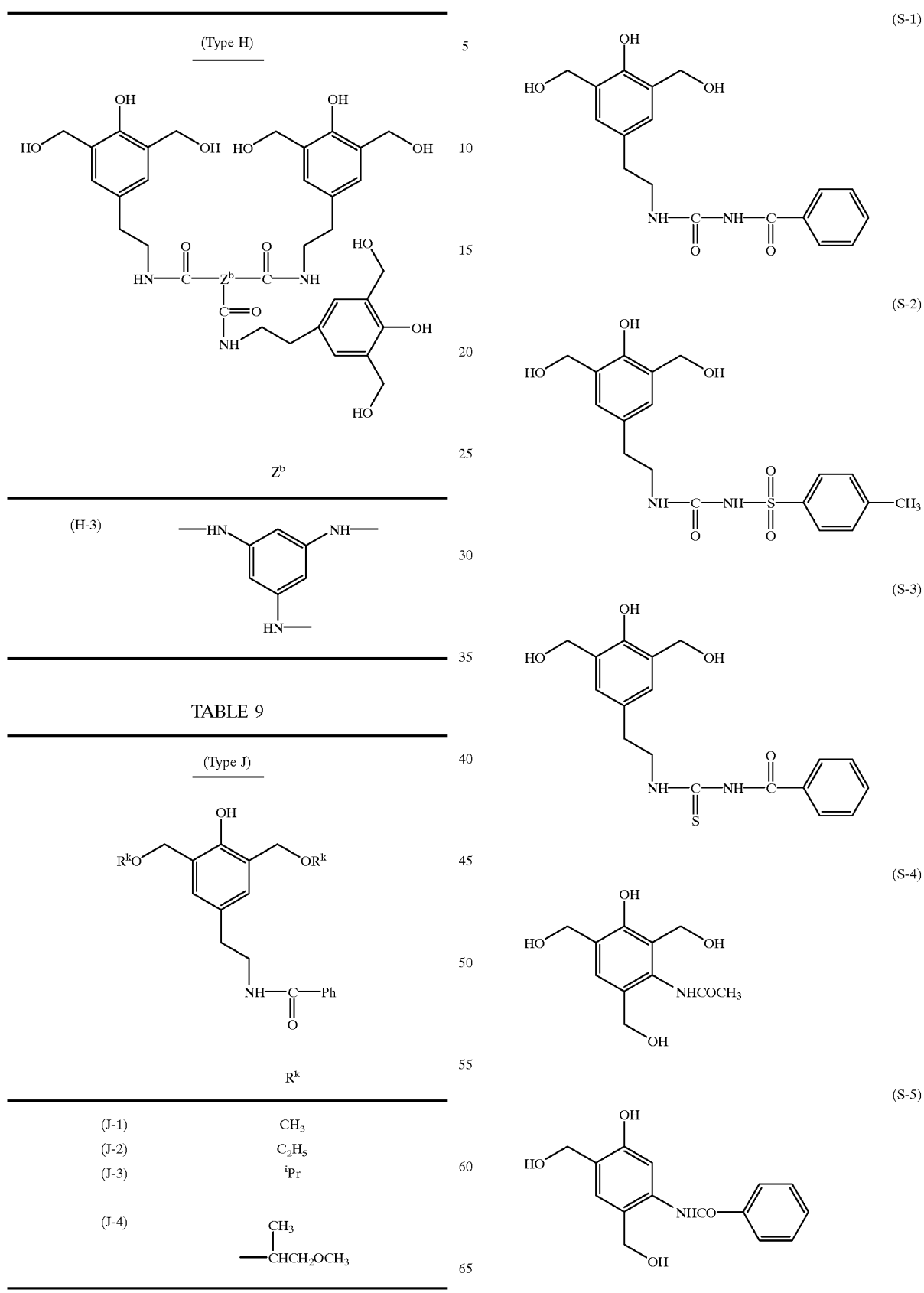

(S-6)
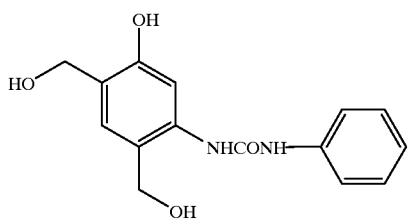
(S-7)
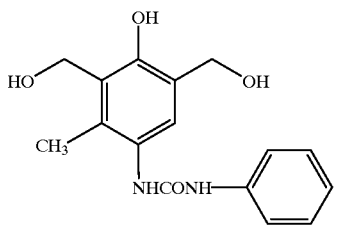
(S-8)
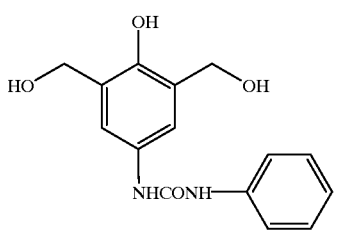
(S-9)
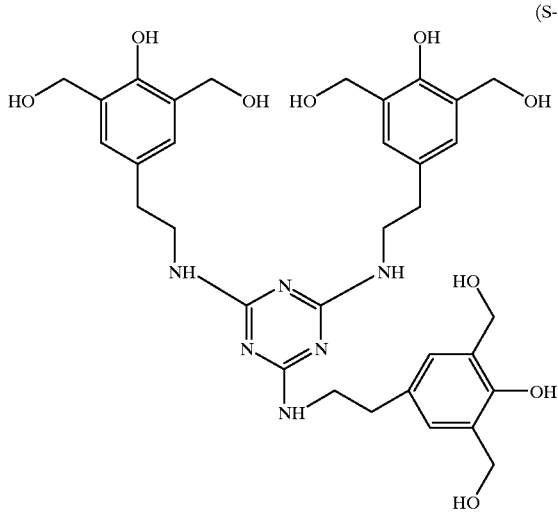
(S-10)
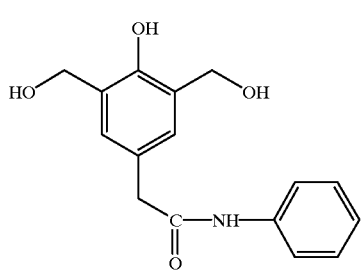
(S-11)
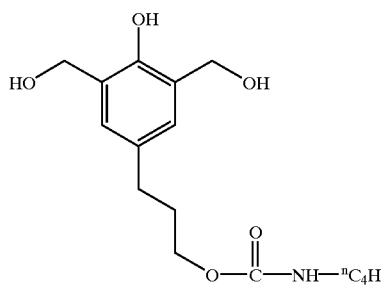
(S-12)
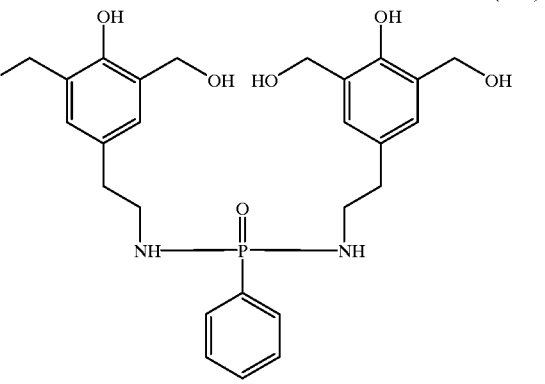
(S-13)
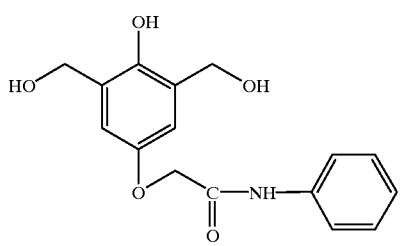
(S-14)
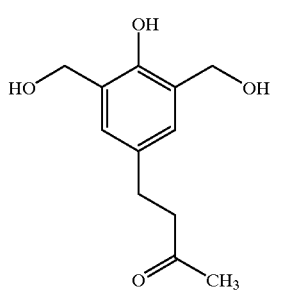
(S-15)
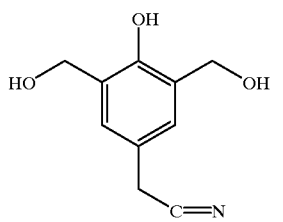

(S-16) 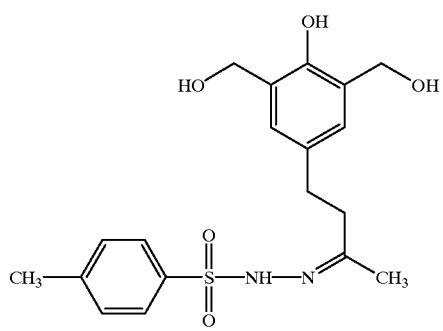
(S-17) 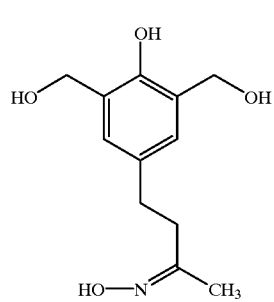
(S-18) 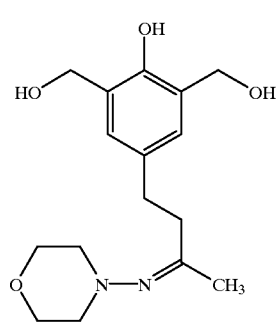
(S-19) 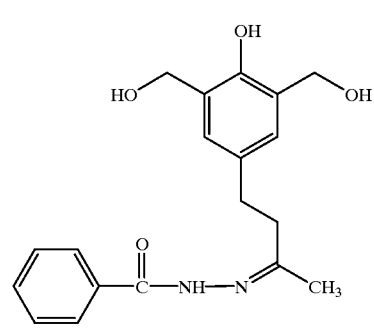
(S-20) 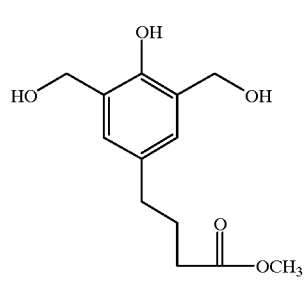
(S-21) 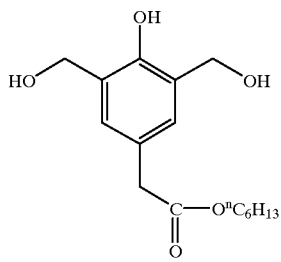
(S-22) 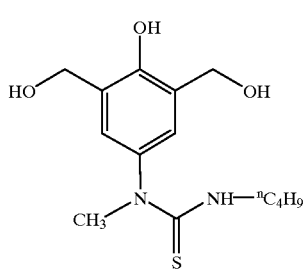
(S-23) 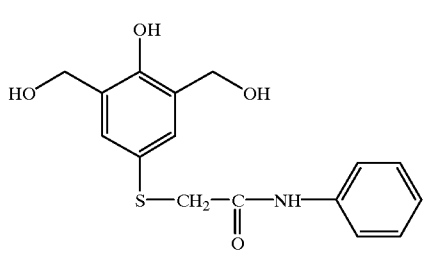
(S-24) 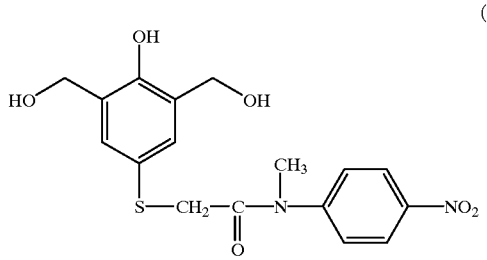
(S-25) 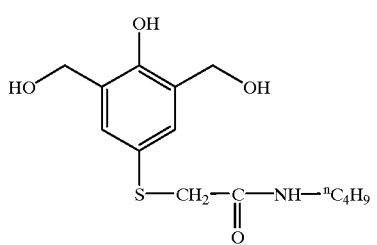
(S-26) 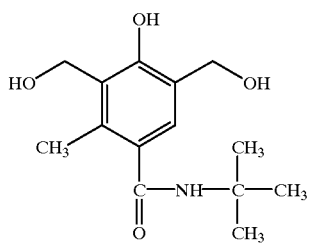

(S-27) 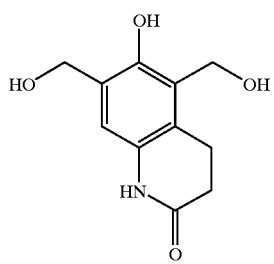
(S-28) 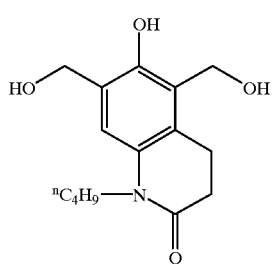
(S-29) 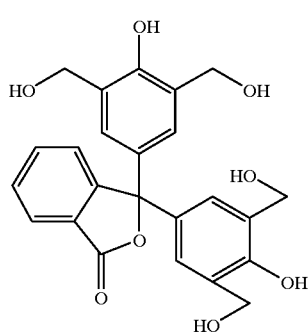
(S-30) 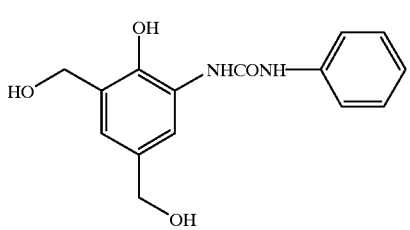
(S-31) 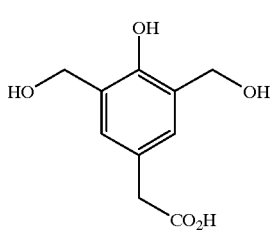
(S-32) 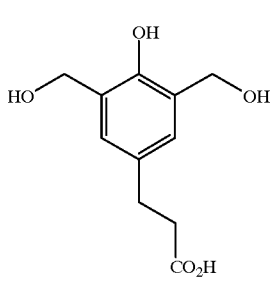
(S-33) 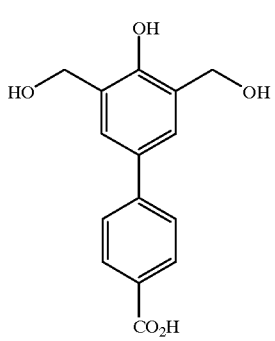
(S-34) 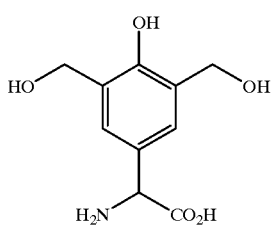
(S-35) 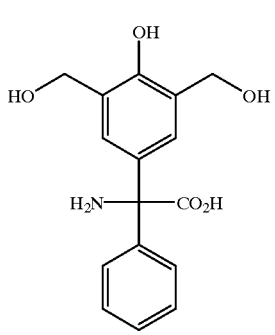
(S-36) 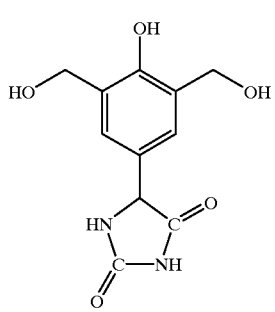
(S-37) 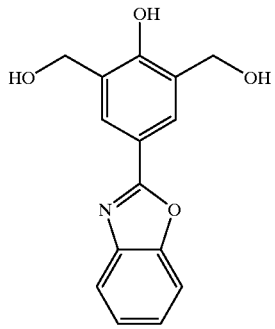

-continued
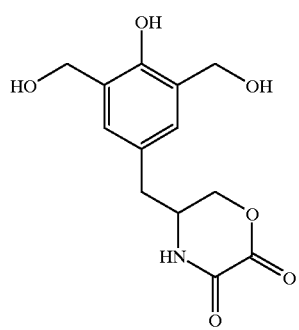
(S-38)
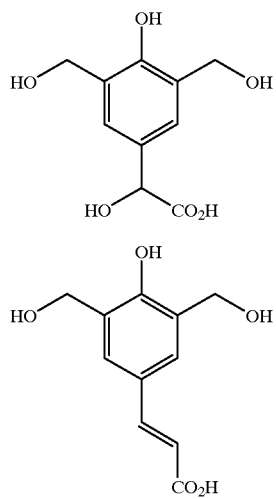
(S-39)
(S-40)
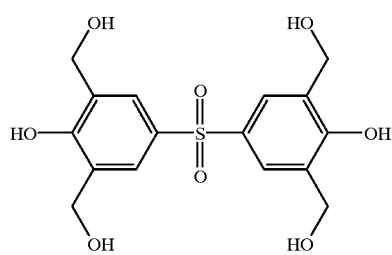
(S-41)
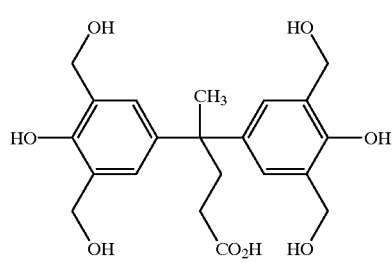
(S-42)
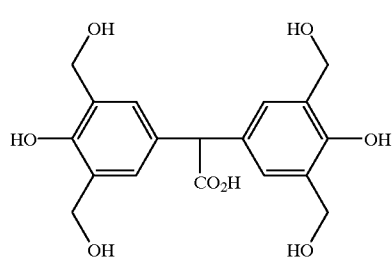
(S-43)
-continued
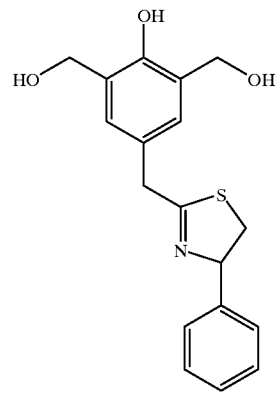
(S-44)
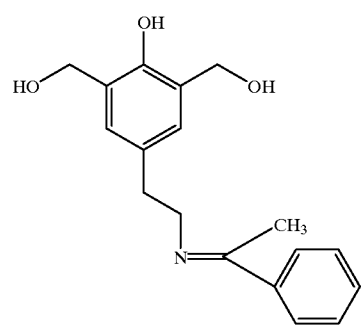
(S-45)
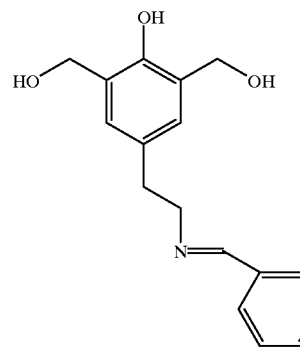
(S-46)
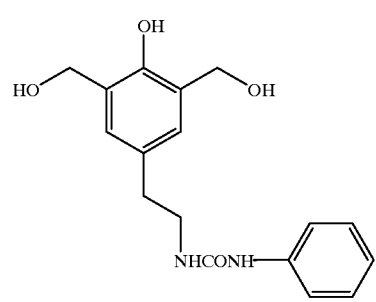
(S-47)

-continued
(S-48)
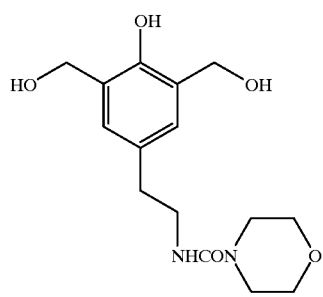
(S-49)
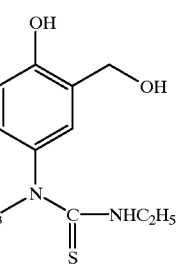
(S-50)
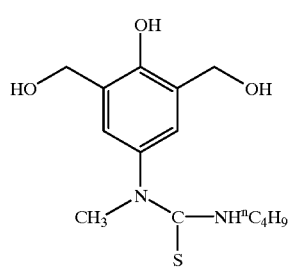
(S-51)
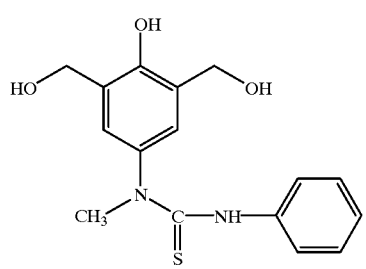
(S-52)
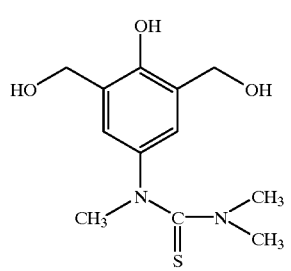
-continued
(S-53)
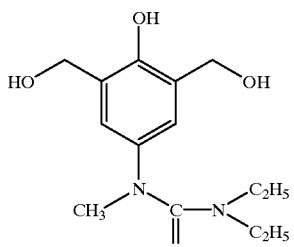
(S-54)
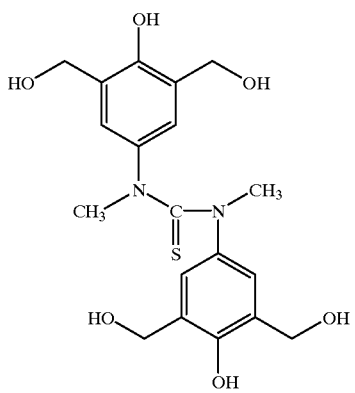
(S-55)
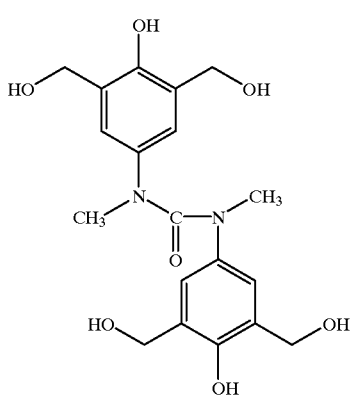
(S-56)
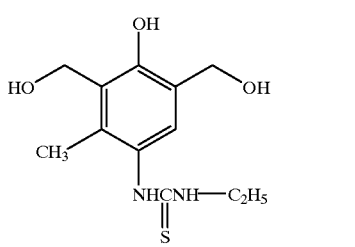
(S-57)
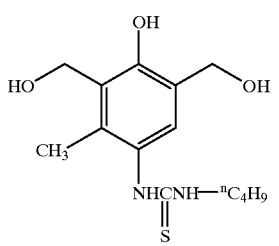

(S-58) 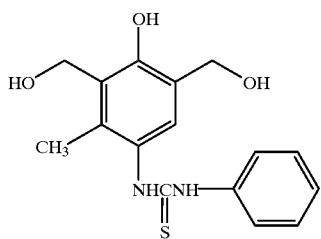
(S-59) 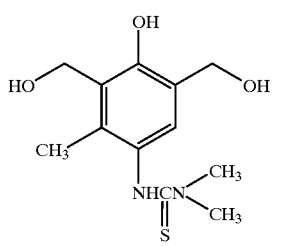
(S-60) 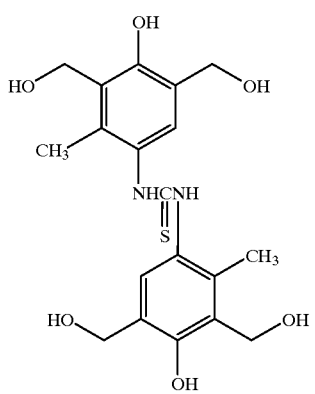
(S-61) 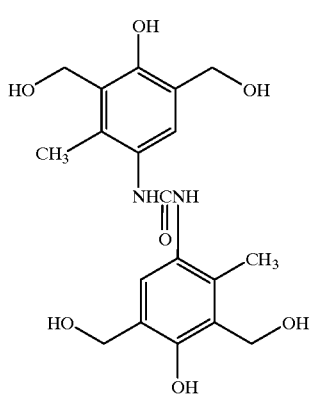
(S-62) 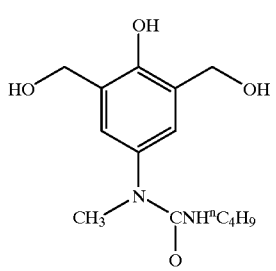
(S-63) 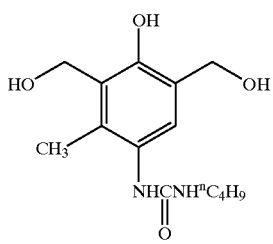
(S-64) 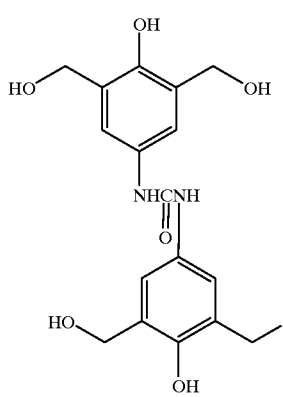
(S-65) 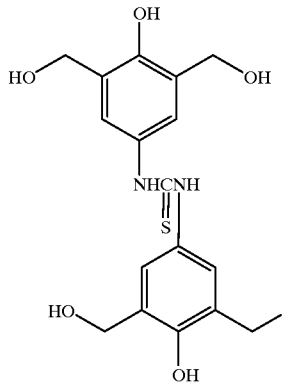
(S-66) 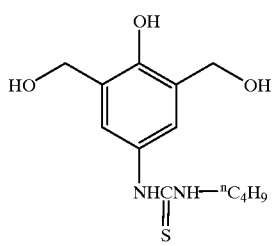
(S-67) 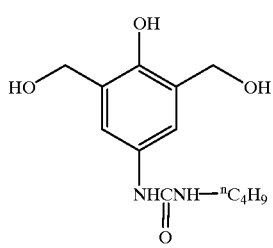

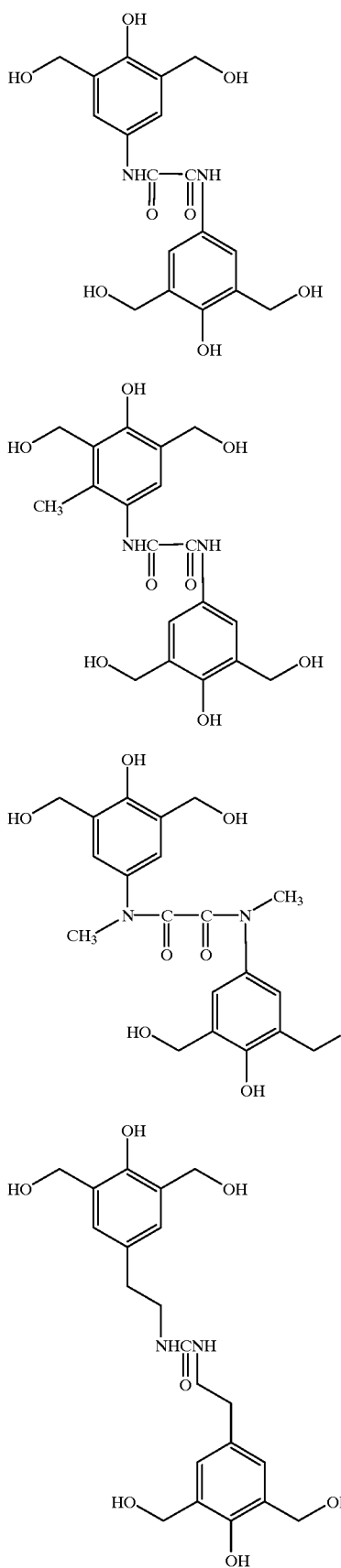
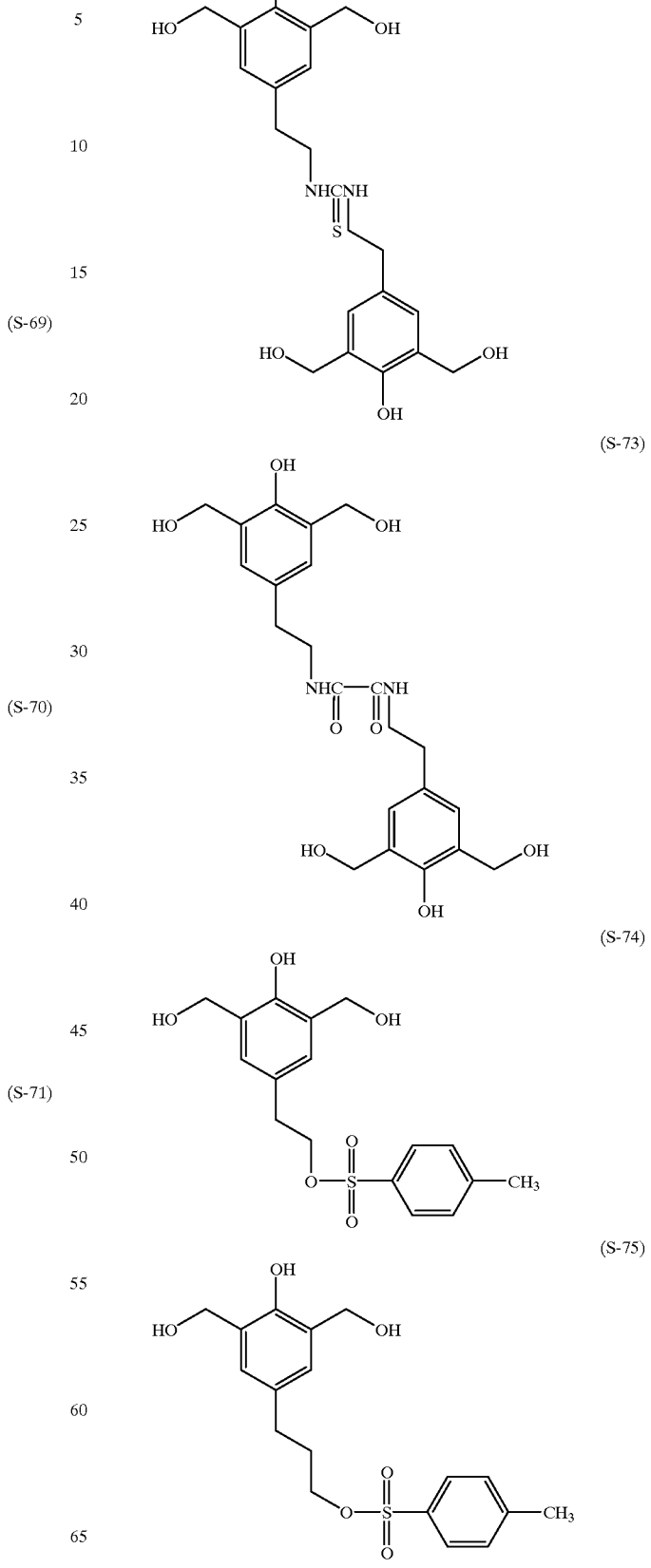

(S-76)

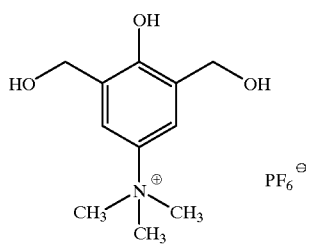

(S-77)

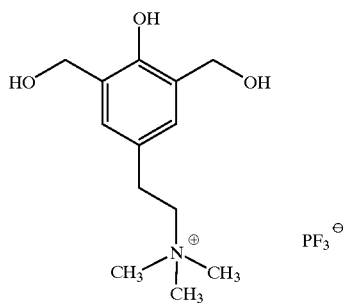

(S-78)

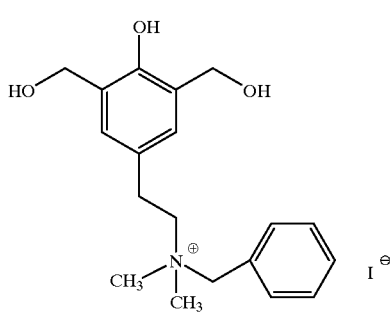

Of these compounds, lower molecular weight phenol derivatives having an amide structure or a urea structure are not known as cross-linking agents, and are preferable in view of their excellent effect.

These lower molecular weight phenol derivatives useful as cross-linking agents can be synthesized by conventionally known methods. General synthesis methods are shown in the following schemes I and II.

Scheme I

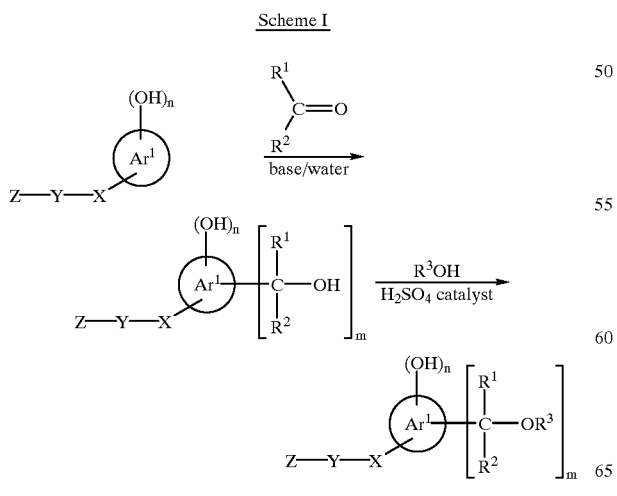

wherein, "base" represents a strong alkali, for example, KOH, NaOH, $Me_4N^+OH$ or the like.

Scheme II

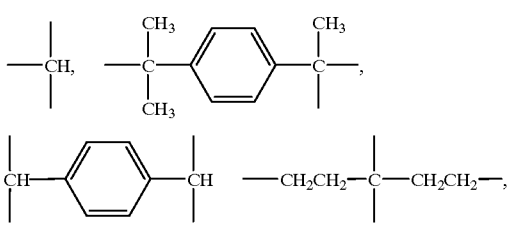

That is, a compound of the general formula (I) can be synthesized from a corresponding phenol derivative via hydroxyalkylation and alkoxylation using a carbonyl compound.

These lower molecular weight phenol derivatives may be used singly or in combination of two or more species. When these phenol derivatives are synthesized, phenol derivatives may be mutually condensed to produce as by-products impurities such as dimers, trimers and the like. These phenol derivatives may be used containing these impurities. Even in this case, the contained amount of the impurities is preferably 30% or less, more preferably 20% or less.

Next, the polynuclear phenol cross-linking agent represented by the general formula (II) will be described. The polynuclear phenol cross-linking agent represented by the general formula (II) used as a cross-linking component in mixture with the above-described lower molecular weight phenol derivative represented by the general formula (I) is a polynuclear phenol cross-linking agent having in the molecule 3 or more phenol rings having 2 or 3 hydroxymethyl groups on the ring as is apparent from the structural formula.

A in the general formula (II) is an r-valent hydrocarbon connecting group having 1 to 20 carbon atoms, and is prepared by removing hydrogen atoms from a skeleton formed with a normal chain, branched or cyclic alkyl group or aryl group to obtain an r-valent group.

Preferable specific examples of the connecting group A include groups represented by the following structural formulae.

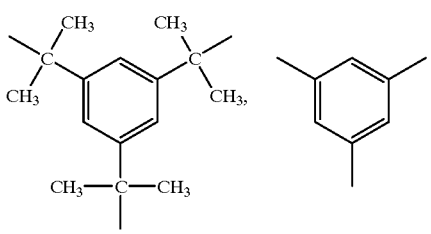

Preferable specific examples of the polynuclear phenol cross-linking agent represented by the general formula (II) having in the molecule the above-described connecting group A include, but are not limited to, compounds represented by the following formulae (II-1) to (II-6).

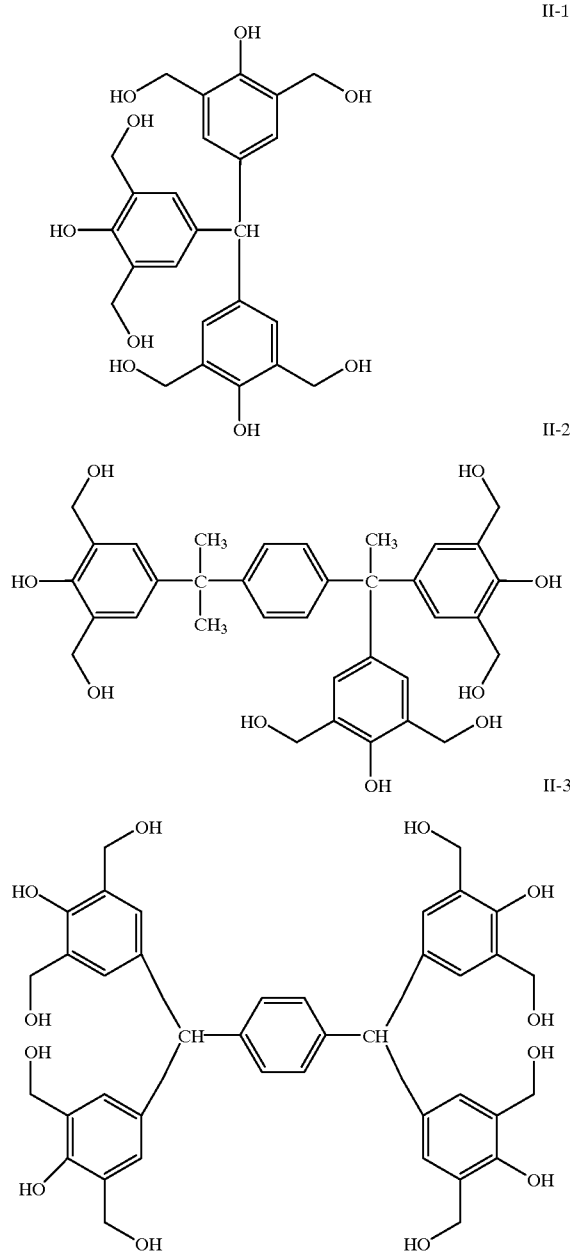

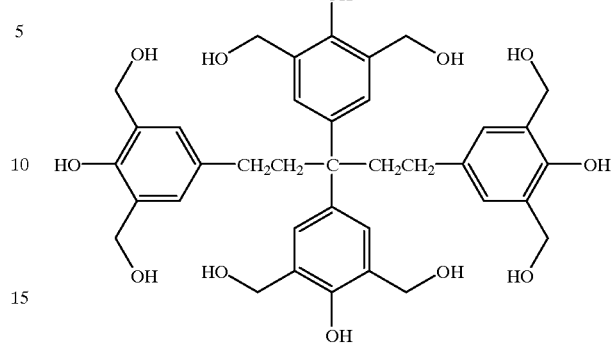

These compounds are obtained by subjecting the corresponding polynuclear phenol to a methylolation reaction, and by subjecting the product to the same route as the scheme explained for the lower molecular weight phenol derivative. In use, the compound may be used containing an oligomer and the like produced as by-products in this methylolation reaction. Even in this case, the contained amount of the by-products is preferably 10% by weight or less.

Here, the resol resin used as a cross-linking component mixed with the lower molecular weight phenol derivative represented by the general formula (I) will be described.

Resol resins usable in the present invention are not particularly restricted, and compounds disclosed as resol resins in GB Patent No. 2,082,399 are preferable, and among these, those having a weight-average molecular weight of 500 to 100,000 and a number-average molecular weight of 200 to 50,000 are listed as suitable examples. Too low a molecular weight means lower cross-linking property and lower printing durability, and too high a molecular weight tends to decrease storage stability. Therefore, both cases are not preferable.

Cross-linking components that can be used in the present invention include (1) a mixture of the lower molecular weight phenol derivative with the polynuclear phenol cross-linking agent, (2) a mixture of the lower molecular weight phenol derivative with the resol resin, and (3) a mixture of the lower molecular weight phenol derivative, the polynuclear phenol cross-linking agent and the resol resin.

In the present invention, the total amount added of the lower molecular weight phenol derivative, the polynuclear phenol cross-linking agent and/or the resol resin is of from 5 to 80% by weight, preferably of from 10 to 60% by weight, based on the total amount of solid components in the image recording layer of the image recording material. When the amount added of the phenol derivative as a cross-linking agent is less than 5% by weight, layer strength of image portions when an image is recorded deteriorates, and when over 80% by weight, stability in storage is not preferable.

These cross-linking components may be prepared previously in the form of a mixture to be used in an image recording material composition, or may be compounded separately in preparing an image material composition. When the mixture is previously prepared, the mixture can be prepared for example by dissolution into an alcohol solvent such as methanol, ethanol, 1-methoxy-2-propanol and the like, a ketone solvent such as acetone, methylethylketone and the like, or a mixture solvent.

It is preferable that the mixing ratio of the two [compound of the formula (I)/(compound of the formula (II) and/or the resol resin)] is of from 10/90% by weight to 90/10% by weight. When the proportion of the lower molecular weight phenol derivative is less than 10/90% by weight, there is a fear of reduction insensitivity or degradation over time. On the other hand, when the proportion of the lower molecular weight phenol derivative is over 90/10% by weight, there is a tendency toward reduction in printing durability. Therefore, both cases are not preferable. The mixing ratio of the two is more preferably of from 30/70% by weight to 70/30% by weight.

[(B) Binder polymer]

In the present invention, there is used as a binder polymer a polymer having in a side chain or main chain thereof an aromatic hydrocarbon ring to which a hydroxyl group or an alkoxy group is directly bonded. As the alkoxy group, those having 20 or less carbon atoms are preferable in view of sensitivity. As the aromatic hydrocarbon ring, a benzene ring, naphthalene ring or anthracene ring is preferable in consideration of availability of raw materials. These aromatic hydrocarbon rings may have a substituent other than a hydroxyl group or alkoxy group, for example, a halogen atom, cyano group and the like, and it is preferable that they do not have a substituent other than a hydroxyl group or alkoxy group.

In the present invention, the binder polymer that can be suitably used include polymers having structural units represented by the following general formula (III), or phenol resins such as novolak resins and the like.

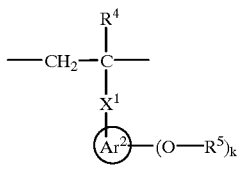

General formula (III)

wherein, $Ar^2$ represents a benzene ring, naphthalene ring or anthracene ring. $R^4$ represents a hydrogen atom or methyl group. $R^5$ represents a hydrogen atom or alkoxy group having 20 or less carbon atoms. $X^1$ represents a single bond or a divalent connecting group containing at least one atom selected from C, H, N, O and S and having 0 to 20 carbon atoms. k represents an integer of 1 to 4.

Examples of structural units represented by the general formula (III) suitably used in the present invention include, but are not limited to, the following units ([BP-1] to [BP-6]).

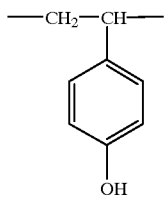
[BP-1]

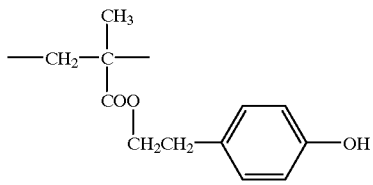
[BP-2]

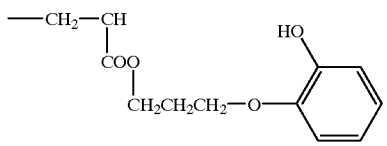
[BP-3]

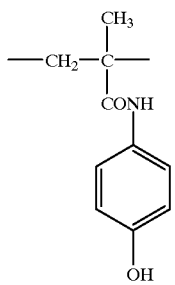
[BP-4]

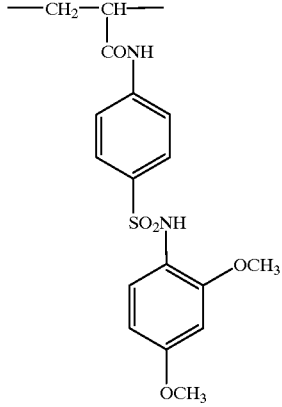
[BP-5]

-continued

[BP-6]

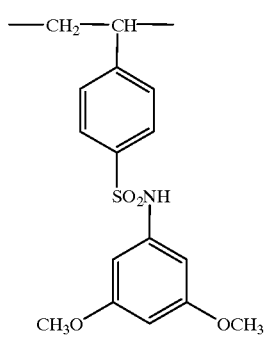

Polymers having these structural units can be obtained by radical polymerization according to conventionally known methods, using corresponding monomers.

In the present invention, a homopolymer composed solely of a structural unit represented by the general formula (III) may be used as the binder polymer, and there may be also used a copolymer having a structural unit derived from a known monomer, together with this specific structural unit. Examples of other known monomers herein used include: acrylates such as methyl acrylate, ethyl acrylate, propyl acrylate, butyl acrylate, 2-ethyrhexyl acrylate, cyclohexyl acrylate, 2-hydroxyethyl acrylate, and benzyl acrylate; methacrylates such as methyl methacrylate, ethyl methacrylate, propyl methacrylate, butyl methacrylate, 2-ethylhexyl methacrylate, cyclohexyl methacrylate, 2-hydroxyethyl methacrylate, and benzyl methacrylate; styrene; acrylonitrile; monomers having an acidic group such as acrylic acid and methacrylic acid, and the like; monomers containing strong acids such as sodium p-styrenesulfonate, alkali metal salt of 2-acrylamide-2-methylpropanesulfonic acid, tetraalkylammonium salt, potassium sulfopropylacrylate and the like; as well as other monomers.

The contained amount of the structural unit represented by formula (III) contained in a copolymer obtained from these monomers is preferably 50 to 100% by weight, more preferably 60 to 100% by weight.

The weight-average molecular weight of a polymer used in the present invention is preferably 5,000 or more, more preferably in a range of 10,000 to 300,000. The number-average molecular weight thereof is preferably 1,000 or more, more preferably 2,000 to 250,000. The polydispersity (weight-average molecular weight/number-average molecular weight) of the polymer is 1 or more, more preferably within a range of from 1.1 to 10.

These polymers may be random polymers, block polymers, graft polymers, or the like, but are preferably random polymers.

Examples of a useful solvent in the preparation of the polymer used in the present invention include tetrahydrofuran, ethylene dichloride, cyclohexanone, methylethyl ketone, acetone, methanol, ethanol, ethyleneglycol monomethyl ether, ethylene glycol monoethylether, 2-methoxyethyl acetate, diethylene glycol dimethylether, 1-methoxy-2-propanol, 1-methoxy-2-propylacetate, N,N-dimethylformamide, N,N-dimethylacetamide, toluene, ethyl acetate, methyl lactate, ethyl lactate, dimethyl sulfoxide, and water. These solvents may be used singly or in combination of two or more species.

As a radical polymerization initiator employed in preparation of the polymer used in the present invention, a conventional compound such as an azo-type initiator, a peroxide initiator, or the like may be used.

Next, novolaks will be described. Examples of novolak resins suitably used in the present invention include phenol novolaks, various o-, m- and p-cresol novolaks, copolymers thereof, and novolaks prepared by using phenols substituted by a halogen atom, an alkyl group or the like.

The weight-average molecular weight of these novolak resins is preferably 1,000 or more, further preferably in a range of from 2,000 to 20,000. The number-average molecular weight is preferably 1,000 or more, further preferably in a range of from 2,000 to 15, 000. The polydispersity is preferably 1 or more, further preferably in a range of from 1.1 to 10.

The binder polymers described above used in the present invention may be used singly or in admixture of two or more species. These polymers are added to the image recording layer of the image recording material in an added amount of 20 to 95% by weight, preferably of 40 to 90% by weight, based on the total weight of the solid components of the image recording layer. If the amount is less than 20% by weight, the strength of image portions after images are formed becomes insufficient, whereas if it is more than 95% by weight, images cannot be formed.

By simultaneous use of the above-described cross-linking component (A) obtained by mixing the phenol derivative, the polynuclear phenol cross-linking agent and/or the resol resin, and the binder polymer (B) having a specific structure, sensitivity to laser exposure and storage stability in a high humidity environment are improved. Though the reason for this is not necessarily apparent, that which has a specific functional group on a cross-linking agent was found to be excellent in sensitivity and storage stability, from the results of various comparative examples. Further, the effect of this specific functional group was studied and considered, and it was discoverd that the above-described simultaneous improvement in sensitivity and storage stability is possible when interaction of the functional group with a phenolic OH group (hydrogen bond or donor-acceptor or acid-base interaction) is high, for example, when enthalpy ($-\Delta H$) of interaction between a model compound having each functional group and phenol satisfies the following relationship as described in "Hydrogen Bonding" Joesten Schaad ed. pp. 291 to 381, to cite a known literature.

$-\Delta H > 3.0$ kcal/mol

By this, the essence of the present invention is hypothesized to lie in the following: because of use of the lower molecular weight phenol derivative as a cross-linking agent having strong interaction with the phenolic OH group of the binder polymer, quality of film in mixing is enhanced against external factors (water, heat) and the lower molecular weight phenol derivative is present at close proximity to phenol to increase cross-linking efficiency; further, because of simultaneous use of the polynuclear phenol derivative having high printing durability and the resol resin as cross-linking agents, the lower molecular weight phenol derivative and the above-described binder, cross-linking components to be mixed form a new intermolecular network, to compound respective advantages. It is thought that the same theory can be applied to the binder having an alkoxy group. Further, it has been found that when cross-linking agents of the present invention are used, so-called bleeding, wherein when an excess amount of the cross-linking agents are mixed in, only the cross-linking agents separate from the binder and crystallize out on the surface, is remarkably improved as compared with a conventional cross-linking agent. This is also believed to support the above-described hypothesis.

Further, the above-described hypothesis is also thought to be supported by the fact that sufficient sensitivity is obtained even if a phenolic OH group is carried on a side chain of a binder like polyhydroxystyrene, and by the fact that sufficient sensitivity is also obtained even if a cross-linking agent to be simultaneously used is itself polyfunctional and has a relatively large molecular weight, by using mixtures of the cross-linking agents of the present invention.

[(C) Compound generating acid upon heating]

A compound which generates an acid upon heating of the present invention (hereinafter, referred to as an acid-generating agent as is appropriate) denotes a compound which decomposes with heat of 100° C. or higher to generate an acid. As the generated acid, a strong acid having a pKa of 2 or less such as sulfonic acid or hydrochloric acid is preferable.

Onium salts such as iodonium salts, sulfonium salts, phosphonium salts, and diazonium salts are preferably used as the acid-generating agent in the present invention. Specifically, acid-generating agents described in U.S. Pat. No. 4,708,925 or JP-A No. 7-20629 may be used. Particularly, an iodonium salt, sulfonium salt, or diazonium salt containing a sulfonic acid ion as a counter ion is preferred. As for the diazonium salts, a diazonium compound described in U.S. Pat. No. 3,867,147, a diazonium compound described in U.S. Pat. No. 2,632,703, and a diazo resin described in JP-A Nos. 1-102456 and 1-102457 are also preferable. Examples of other preferable acid-generating agents include benzylsulfonates described in U.S. Pat. Nos. 5,135,838 and 5,200,544; active sulfonates or disulfonyl compounds described in JP-A Nos. 2-100054 and 2-100055 and Japanese Patent Application No. 8-9444; and haloalkyl-substituted S-triazines described in JP-A No. 7-271029.

These acid-generating agents are added to the image recording layer of the image recording material in an amount of 0.01 to 50% by weight, preferably 0.1 to 40% by weight, and more preferably 0.5 to 30% by weight based on the total weight of the solid components of the image recording layer. If the amount of the acid-generating agent is less than 0.01% by weight, images cannot be formed, whereas if it is more than 50% by weight, stains are generated at non-image areas when printing.

These acid-generating agents may be used singly or in combinations of two or more species. Since the acid-generating agent herein listed as examples can be decomposed even with irradiation of an ultraviolet ray, the image recording material of the present invention allows image recording not only with an infrared ray but also with an ultraviolet ray.

[(D) Infrared light absorbing agent]

A main object of the present invention is to provide a recording material that allow image recording using a laser emitting infrared light. For this object, it is recessary to use simultaneously an infrared light absorbing agent. Namely, the infrared ray absorbing agent has a function of converting absorbed infrared light to heat, and with the heat generated, the acid-generating agent (C) decomposes to generate an acid. A dye or a pigment effectively absorbing an infrared light of wavelengths ranging from 760 nm to 1,200 nm is used as the infrared ray absorbing agent in the present invention. Preferably the dye or the pigment has a maximum absorption peak at a wavelength between 760 nm and 1,200 nm.

Dyes on the market and conventional dyes described in "Senryo Binran (Dye Handbook)" (edited by The Society of Organic Synthetic Chemistry, Japan 1970) may be used. Examples of such dyes include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium salts, and metal thiolate complexes.

Examples of preferable dyes include cyanine dyes described in, for example, JP-A Nos. 58-125246, 59-84356, 59-202829, and 60-78787; methine dyes described in, for example, JP-A Nos. 58-173696, 58-181690, and 58-194595; naphthoquinone dyes described in, for example, JP-A Nos. 58-112793, 58-224793, 59-48187, 59-73996, 60-52940, and 60-63744; squarylium dyes described in, for example, JP-A No. 58-112792; and cyanine dyes described in GB Patent No. 434,875.

Near-infrared ray absorbing sensitizers described in U.S. Pat. No. 5,156,938 are also preferably used. In addition, the following compounds are also preferred: arylbenzo(thio)pyrylium salts described in U.S. Pat. No. 3,881,924; trimethinethiapyrylium salts described in JP-A No. 57-142645 (U.S. Pat. No. 4,327,169; pyrylium compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds disclosed in Japanese Patent Application Publication (JP-B) Nos. 5-13514 and 5-19702.

Other dyes described in the specification of U.S. Pat. No. 4,756,993 as near-infrared ray absorbing dyes represented by formulae (I) and (II) may also be preferably used.

Of these dyes, particularly preferred are cyanine dyes, squarylium dyes, pyrylium dyes, and nickel thiolate complexes.

Pigments that may be used in the present invention include commercially available pigments and pigments described in "Color Index (C.I.) Handbook", or "Saishin Ganryo Binran" (Current Pigment Handbook) (edited by Nippon Ganryo Gijutsu Kyokai, 1977), "Saishin Ganryo Ouyou Gijutsu" (Current Pigment Application Technology) (published by CMC Shuppan, 1986), and "Insatsu Inki Gijutsu" (Printing Ink Technology) (published by CMC Publishing, 1984).

Different types of pigments may be used, including the following examples: black pigments, yellow pigments, orange pigments, brown pigments, red pigments, purple pigments, blue pigments, green pigments, fluorescent pigments, metallic powder pigments, and other pigments such as polymer-bonded dyes. Specifically, mention may be made of insoluble azo pigments, azolake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, carbon black, and the like. Of these pigments, carbon black is preferred.

These pigments may be used as they are (i.e., without surface treatment) or after being surface-treated. Surface treatment methods include surface coating with a resin or wax, depositing an surfactant, and binding a reactive substance (such as silane coupling agents, epoxy compounds, polyisocyanates) to pigment surfaces. These surface treatment methods are described in "Kinzoku-sekken no Seishitsu to Ouyou" (Properties of Metallic Soaps and their Applications) (Sachi Shobo), "Insatsu Inki Gijutsu" (Printing Ink Technology) (published by CMC Publishing, 1984), and "Saishin Ganryo Ouyou Gijutsu" (Current Pigment Application Technology) (published by CMC Shuppan, 1986).

The particle size of the pigments preferably falls within a range of 0.01 to 10 µm, more preferably 0.05 to 1 µm, and particularly preferably 0.1 to 1 µm. Particle sizes of less than 0.01 µm are not preferred from the standpoint of stability of a dispersion in a coating solution for an image recording layer, whereas particle sizes greater than 10 µm are not preferred from the standpoint of formation of a uniform image recording layer.

The pigments are dispersed by known techniques used in the manufacture of ink and toners. Dispersing apparatuses include: an ultrasonic disperser, a sand mill, an attritor, a pearl mill, a super mill, a ball mill, and impeller, a disperser, a KD mill, a colloid mill, a dynatron, a three roll mill, and a pressurized kneader. For details, see "Saishin Ganryo Ouyou Gijutsu" (Current Pigment Application Technology) (published by CMC Publishing, 1986).

These dyes or pigments are incorporated into the image recording material in amounts of 0.01 to 50% by weight, preferably 0.1 to 10% by weight, in the case of dyes, particularly preferably 0.5 t o 10% by weight, and in the case of pigments, particularly preferably 1.0 to 10% by weight, all based on the total solid content of the image recording layer of the image recording material. When the amount of the dyes or pigments is less than 0.01% by weight, sensitivity decreases, whereas when it is in excess of 50% by weight, non-image areas may be stained during printing.

These dyes or pigments may be incorporated in the same layer as other components. Alternatively, the dyes or pigments may be incorporated into a layer other than the layers in which the other components are incorporated.

[Other components]

In the present invention, a variety of compounds other than those listed above may be incorporated as desired. For example, dyes exhibiting an extensive absorption in the visible light range may be used as an image forming colorant. Specific examples include Oil Yellow #101, Oil Yellow #103, Oil Pink #312, 1 Green BG, Oil Blue BOS, Oil Blue # 603, Oil Black BY, Oil Black BS, Oil Black T-505 (all of these are manufactured by Orient Chemical Industries Co., Ltd.), Victoria Pure Blue, Crystal Violet (CI42555), Methyl Violet (CI42535), Ethyl Violet, Rhodamine B (CI145170B), Malachite Green (CI42000), and Methylene Blue (CI52015), Aizenspiron Blue C-RH (manufactured by Hodogaya Kagaku K.K.) as well as dyes disclosed in JP-A No. 62-293247.

Because these dyes allow easy discernment between image and non-image areas after formation of images, incorporation of these dyes is recommended. The amount of the dye(s) is of from 0.01 to 10% by weight with respect to the total solid content of the image recording layer of the image recording material.

In order to improve stability of processing to variation in development conditions, the image recording material of the present invention may incorporate nonionic surfactants disclosed in JP-A Nos. 62-251740 and 3-208514 and amphoteric surfactants disclosed in JP-A Nos. 59-121044 and 4-13149.

Specific examples of nonionic surfactants include sorbitan tristearate, sorbitan monopalmitate, sorbitan trioleate, monoglyceride stearate, and polyoxyethylene nonyl phenyl ether.

Specific examples of amphoteric surfactants include alkyl di(aminoethyl)glycine, alkylpolyaminoethylglycine hydrochloride, 2-alkyl-N-carboxyethyl-N-hydroxyethylimidazolinium betaine, N-tetradecyl-N,N-betaine (for example, Amogen Kl trade name, manufactured by Daiichi Kogyo K.K.).

The proportion of the aforementioned nonionic surfactants or amphoteric surfactants to be contained in the image recording layer of the image recording material is preferably of from 0.05 to 15% by weight, more preferably of from 0.1 to 5% by weight.

The image recording material of the present invention may optionally contain a plasticizer so as to impart flexibility to the coating layer. For example, there may be used polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The image recording material of the present invention is generally formed by dissolving the above-described respective components in a solvent and applying the resultant solution onto a suitable support. Examples of usable solvents include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene, and water. These solvents are used singly or in combination. The conentration of the above-described components (the entirety of the solid components including additives) in the solvent is preferably of 1 to 50% by weight. The amount of coating (solid content) obtained on the support after application and drying, which varies in accordance with use, is generally of 0.5 to 5.0 g/m$^2$ in the case of planographic printing plate materials. The coating solution may be applied by use of various methods rgenerally used for such purposes, for example: bar coater coating, rotary coating, spray coating, curtain coating, dipping coating, air knife coating, blade coating, roller coating and the like. The smaller the amount, the greater the apparent sensitivity, but layer characteristics of the image recording layer deteriorate.

The image recording material of the present invention may contain a surfactant, for example, a fluorine-containing surfactant disclosed in JP-A No. 62-170950 to improve coating characteristics. It is preferably incorporated in an amount of from 0.01 to 1% by weight, more preferably from 0.05 to 0.5% by weight, based on the entirety of the solid content of the coated layer of the image recording material.

[Support]

The support to which the coating layer of the image recording material of the present invention can be applied is a dimensionally stable, plate-like material. Examples of the support include paper, plastic-laminated (e.g., polyethylene, polypropylene, polystyrene, and the like) paper, metal plates (e.g., aluminum, zinc, copper, etc.), plastic films (e.g., cellulose diacetate, cellulose triacetate, cellulose propionate, cellulose lactate, cellulose acetate lactate, cellulose nitrate, polyethylene terephthalate, polyethylene, polystyrene, polypropylene, polycarbonate, polyvinyl acetal, etc.), and paper or plastic films laminated or vapor-deposited with a metal such as one selected from among the above-mentioned metals.

Preferably, a polyester film or an aluminum plate is used. An aluminum plate is particularly preferred due to its excellent dimensional stability and comparatively low price. A pure aluminum plate and an aluminum-based alloy sheet containing traces of hetero-elements are preferably used. A plastic film laminated or vapor-deposited with aluminum may also be used. Examples of hetero-elements include silicon, iron, manganese, copper, magnesium, chromium, zinc, bismuth, nickel, and titanium. The total amount of the hetero-elements is 10% by weight or less. Although pure aluminum is particularly suitable in the present invention, aluminum may contain traces of hetero-elements in view of the fact that refining pure aluminum is difficult. Thus, the composition of the aluminum plate that may be used in the present invention is not particularly limited, and conventionally known aluminum plates may be suitably selected. The thickness of the aluminum plate used in the present invention is approximately of 0.1 to 0.6 mm, preferably of 0.15 to 0.4 mm, and particularly preferably of 0.2 to 0.3 mm.

Before roughening the aluminum plate, a degreasing step may be performed to remove the rolling oil from the plate surface. The degreasing step is performed by use of a surfactant, an organic solvent, or an aqueous alkali solution.

The surface of an aluminum plate may be roughened by use of a variety of methods: mechanical roughening, electrochemical dissolving, or chemical dissolving of the surface selectively. Mechanical methods that may be used include a ball-graining method, brush-graining method, blast-graining method, buffing, and other known methods. Electrochemical roughening may be performed by applying an AC or DC current in an electrolytic solution containing hydrochloric acid or nitric acid. Alternatively, mechanical and electrochemical methods may be used in combination as described in JP-A No. 54-63902.

The thus-roughened aluminum plate is subjected to alkali etching and neutralizing if necessary, and subsequently to anodizing so as to enhance water-retainability and abrasion resistance of the surface as desired. As electrolytes that may be used for anodizing, a number of electrolytes that form a porous oxide layer may be used. In general, sulfuric acid, phosphoric acid, oxalic acid, chromic acid, and mixtures thereof may be used. The concentration of the electrolyte is suitably determined in accordance with the type of the electrolyte.

The processing conditions for anodizing the plate vary in accordance with the electrolyte employed, and thus cannot be specified unconditionally. However, the conditions are generally such that the concentration of the electrolytes is 1 to 80% by weight, liquid temperature is 5 to 70° C., current density is 5 to 60 A/dM$^2$, voltage is 1 to 100 V, and duration of electrolysis is from 10 seconds to 5 minutes.

When the amount of an anodized layer is less than 1.0 g/m$^2$, printing durability is unsatisfactory, or non-image portions of the planographic printing plate become scratched or damaged more easily. A so-called "scratch toning" is caused in which ink is deposited on scratched portions during printing.

If necessary, the surface of the aluminum plate may be subjected to additional treatment to impart hydrophilization thereof after being anodized. Examples of such treatments which may be usable in the present invention include methods making use of an alkali metal silicate (e.g., sodium silicate) described in U.S. Pat. Nos. 2,714,066, 3,181,461, 3,280,734, and 3,902,734. According to this method, a support is soaked in an aqueous sodium silicate solution or subjected to electrolytic processing. Other usable methods include treatment with potassium fluorozirconate disclosed in Japanese Patent Application Publication (JP-B) No. 36-22063 and treatment with polyvinylphosphonic acid disclosed in U.S. Pat. Nos. 3,276,868, 4,153,461, and 4,689, 272.

[Others]

Prior to the application of the image recording material of the present invention to a support, the support may be provided with an undercoat layer if necessary.

A variety of organic compounds may be used as a component of the undercoat layer. Examples include: carboxymethyl cellulose; dextrin; gum arabic; phosphonic acids having an amino group such as 2-aminoethylphosphonic acid group; organic phosphonic acids such as (substituted) phenylphosphonic acid, (substituted) naphthylphosphonic acid, (substituted) alkylphosphonic acid, (substituted) glycerophosphonic acid, (substituted) methylenediphosphonic acid, and (substituted) ethylenediphosphonic acid; organic phosphoric acids such as (substituted) phenylphosphoric acid, (substituted) naphthylphosphoric acid, (substituted) alkylphosphoric acid, and (substituted) glycerophosphoric acid; organic phosphinic acids such as (substituted) phenylphosphinic acid, (substituted) naphthylphosphinic acid, (substituted) alkylphosphinic acid, and (substituted) glycerophosphinic acid; amino acids such as glycine and β-alanine; and amine hydrochlorides having a hydroxyl group such as triethanolamine hydrochloride. These compounds may be used in combinations of two or more. In addition, the above mentioned diazonium compo unds are also preferable.

A suitable coating amount of the undercoat layer is from 2 to 200 mg/m$^2$.

Thus, a planographic printing plate material using the image recording material of the present invention can be prepared. This planographic printing plate material can be recorded with an infrared laser. Thermal recording with an ultraviolet ray lamp and thermal head is also possible. In the present invention, it is preferable that imagewise-exposure is conducted by using a solid-state or semiconductor laser device that emits infrared rays having a wavelength of 760 nm to 1,200 nm.

In the present invention, developing processing may be conducted immediately after irradiation. Alternatively, a thermal treatment may be performed between an irradiation step and a developing step. When a thermal treatment is performed, the temperature is within a range of 60° C. to 150° C., and the length of time is between five seconds to five minutes. Various conventionally known heating methods may be used: a method in which heating is conducted with a panel heater or a ceramic heater brought into contact with a recording material, and a non-contact heating method employing a lamp and hot air, and the like. The thermal treatment is effective in decreasing the laser energy required for recording during laser irradiation.

After the thermal treatment has been performed, the image recording material of the present invention is developed according to necessity with, preferably, water or an aqueous alkali solution.

When the aqueous alkaline solution is used, any conventionally known aqueous alkaline solution may be used as the developer or replenisher for use with the image recording material of the present invention. For example, there may be used inorganic alkali salts such as sodium silicate and potassium silicate; sodium phosphate, potassium phosphate, and ammonium phosphate; disodium hydrogenphosphate, disodium hydrogenphosphate, and diammonium hydrogenphosphate; sodium carbonate, potassium carbonate, and ammonium carbonate; sodium hydrogencarbonate, potassium hydrogencarbonate, and ammonium hydrogencarbonate; sodium borate, potassium borate, and ammonium borate; and sodium hydroxide, ammonium hydroxide, potassium hydroxide, and lithium hydroxide. In addition, there may also be used organic alkali agents such as monomethylamine, dimethylamine, triethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents may be used singly or in combination of two or more.

Of the above-listed alkali agents, particularly preferred are aqueous solutions of a silicate such as sodium silicate or potassium silicate. This is because developability can be varied by altering the ratio of a silicon oxide ($SiO_2$), which is a component of a silicate, to an alkali metal oxide ($M_2O$) or the concentrations of these components. For example, alkali metal silicates described in JP-A No. 54-62004 and JP-B No. 57-7427 are effectively used.

When an automatic processor is used for carrying out development, it is known that an increased number of plate materials for planography can be processed without changing the developing solution in the developing solution tank for a long period, if an aqueous solution (replenisher) having a higher alkalinity than the developing solution is added to the developing solution. In the present invention, this approach of employing a replenisher is preferably applied.

The developing solution and the replenisher may contain a variety of surfactants and organic solvents for different purposes: acceleration or inhibition of developability, dispersion of development scum, and improvement in ink compatibility of the image portions of the printing plate. Preferable surfactants may be anionic, cationic, nonionic, or amphoteric. Preferable organic solvents are led by benzyl alcohol, etc. In addition, polyethylene glycol or its derivatives, as well as polypropylene glycol or its derivatives may be advantageously used.

The developing solution and the replenisher may also contain inorganic reducing agents such as hydroquinone, resorcin, sodium sulfite, sodium hydrogensulfite, potassium sulfite, or potassium hydrogensulfite; an organic carboxylic acid; an antifoaming agent; and a water softener.

Examples of developing solutions that contain the aforementioned surfactants, organic solvents, reducing agents, etc. include developer compositions described in JP-A No. 51-77401 and containing benzyl alcohol, an anionic surfactant, an alkali agent, and water; developer compositions described in JP-A No. 53-44202 and comprising an aqueous solution containing benzyl alcohol, an anionic surfactant, and a water-soluble sulfite; and developer compositions described in JP-A No. 55-155355 and containing an organic solvent having a solubility in water of not more than 10% by weight at ordinary temperature, an alkali agent, and water. These compositions may also be suitably used in the present invention.

Printing plates that have been processed for developing by using the above-described developing solutions and replenishers are post-treated with washing water, a rinse solution containing a surfactant, etc., or with a desensitizing liquid containing gum arabic or starch derivatives. When the image-recording material of the present invention is used as a plate material for printing, post-treatment may include these steps in suitable combinations.

In recent years, automatic processor for processing plate materials for printing have come to be used widely in the plate-making and printing industry, so as to rationalize and standardize the plate-making work. An automatic processor, which generally has a developing section and a post-treatment section, includes a conveyor device for transporting a printing plate material, processing tanks, and spray devices. When this apparatus is used, a printing plate that has been exposed to light is transported horizontally, during which respective processing solutions supplied by pumps are sprayed through spray nozzles to carry out development. According to another method that has come to be known recently, a printing plate material is dipped in processing tanks filled with processing solutions and conveyed by under-water guide rolls or similar means. Automated processing thus enables processing of printing plate materials while a replenisher is added to each processing solution in accordance with the amount of processing or operation time.

In addition, so-called disposable processing-in which materials are always processed with substantially fresh processing solutions-may also be used.

The thus-obtained planographic printing plate is coated with a desensitizing gum and then is advanced to the printing step if desired. When a higher printing durability is desired, the planographic printing plate is subjected to a burning treatment.

When a planographic printing plate undergoes burning, the plate is preferably treated with a counter-etching solution described, for example, in JP-B Nos. 61-2518 and 55-28062, JP-A No. 62-31859, and JP-A No. 61-159655, before burning.

Counter-etching may be performed by applying the counter-etching solution onto the planographic printing plate by use of a sponge or absorbent cotton that has absorbed the counter-etching solution, by dipping the plate in a counter-etching solution filled in a tray, or by using an automatic coater. When the amount of coating is made even with a squeegee or a squeegee roller after application of the counter-etching solution, a more preferable effect is obtainable.

A suitable amount of coating of the counter-etching solution is generally of from 0.03 to 0.8 $g/m^2$ (dry weight).

The planographic printing plate that has been coated with the counter-etching solution is dried if necessary, then heated to a high temperature with a burning processor (e.g., BP-1300; a burning processor sold by Fuji Photo Film Co., Ltd.). Although heating temperature and duration may depend on the type of the components that form images, preferred ranges for temperature and duration are 180 to 300° C. and 10 to 20 minutes, respectively.

If necessary, the planographic printing plate material that has been subjected to the burning treatment may undergo additional processing that have been performed conventionally (such as washing with water and application of gum). When the counter-etching solution containing a water-soluble polymer compound is used, so-called desensitizing processing such as application of gum may be omitted.

The planographic printing plate obtained through the above-described process is set in an offset printing press to produce a great number of prints.

EXAMPLES

The following examples further illustrate the present invention but do not limit the scope thereof.

Synthesis of Cross-linking Agent A-1 p-aminophenol (1 mol) and sodium acetate (1 mol) were charged in a flask together with acetone (1 liter), and formic chloride (1 mol) was added dropwise while ice-cooling. 5 hours later, the mixture was poured into ice water for crystallization, and the crystal was filtered to obtain A-1-x with a yield of 75%.

This A-1-x (0.75 mol), KOH (0.75 mol), 500 ml of water and 37% formalin aqueous solution (4.0 mol) were charged in a flask, and heated at 50° C. for 5 hours. Thereafter, the mixture was poured into 5 liters of acetone for crystallization, the crystal was filtered, and this crystal was dissolved in 100 ml of water. Thereafter, the result was neutralized with potassium hydrogensulfate to carry out crystallization. The crystal was filtered to obtain an intended A-1 with an overall yield of 60%.

The reaction scheme was as follows.

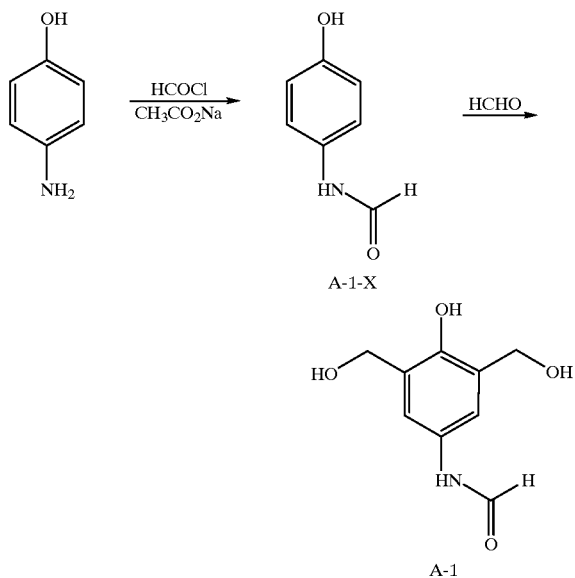

The structure of the obtained intended A-1 was identified by $^1$HNMR, infrared spectroscopic analysis and mass spectrometric analysis.

Synthesis of Cross-linking Agent B-1

Tyramine (1 mol) and sodium acetate (1 mol) were charged in a flask together with acetone (1 liter), and propionic chloride (1 mol) was added dropwise while ice-cooling. 5 hours later, the mixture was poured into ice water for crystallization, and the crystal was filtered to obtain B-1-x with a yield of 75%.

This B-1-x (0.85 mol), KOH (0.85 mol), 500 ml of water and 37% formalin aqueous solution (5.0 mol) were charged in a flask, and heated at 50° C. for 5 hours. Thereafter the mixture was poured into 5 liters of acetone for crystallization, the crystal was filtered, and this crystal was dissolved in 100 ml of water. Thereafter, the result was neutralized with potassium hydrogensulfate to carry out crystallization. The crystal was filtered to obtain an intended B-1 with an overall yield of 65%.

The reaction scheme was as follows.

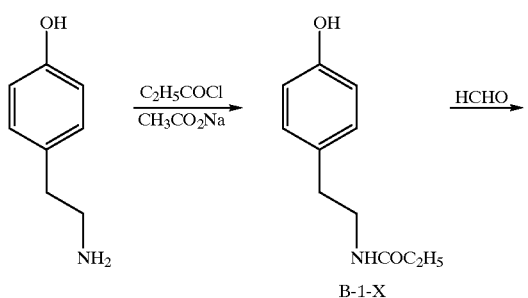

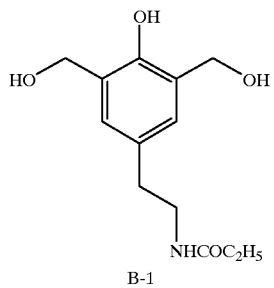

The structure of the obtained intended B-1 was identified by $^1$HNMR, infrared spectroscopic analysis and mass spectrometric analysis.

Other lower molecular weight phenol derivatives can be easily synthesized by general synthesis methods shown in the above-described schemes I and II.

Binder Polymer [BX-1]

Poly-p-hydroxystyrene (trade name: Malkalinker MH2P, manufactured by Maruzen Sekiyu K.K.) This binder polymer has the same structure as that of [BP-1] exemplified as a preferable polymer represented by the general formula (III).

Binder Polymer [BX-2]

Formalin condensed novolak resin of m-cresol/p-cresol (60% by weight/40% by weight). Weight-average molecular weight: 10,000, number-average molecular weight: 6,000 (synthetic product).

Resol Resin (cross-linking component)

Resol resin obtained from bisphenol A and formaldehyde. Weight-average molecular weight: 2,000, number-average molecular weight: 1,000 (synthetic product).

Examples 1 to 20

An aluminum plate (material quality: 1050) having a thickness of 0.30 mm was degreased by washing with trichloroethylene. Thereafter, the surface of the plate was grained by using a nylon brush and a pumice stone powder (400 mesh) water suspension, then washed with water sufficiently. Thereafter, this plate was dipped in a 25% aqueous sodium hydroxide solution (45° C.) for 9 seconds to carry out etching and washed with water. The plate was dipped further in 2% aqueous $HNO_3$ for 20 seconds and washed with water. In this case, the amount of etching on the grained surface was about 3 g/m$^2$. Subsequently, a DC anodized layer (3 g/m$^2$) was formed on the surface of the plate with a current density of 15 A/dm$^2$ in an electrolytic solution containing a 7% $H_2SO_4$ electrolyte, washed with water, and dried. Thereafter, the aluminum plate was coated with an undercoating solution having the following composition and dried at 80° C. for 30 seconds. The amount of coating after drying was 10 mg/m$^2$.

| Undercoating liquid | |
|---|---|
| β-alanine | 0.1 g |
| Phenylphosphonic acid | 0.05 g |
| Methanol | 40 g |
| Pure water | 60 g |

19 types of Solutions [α-1] to [α-20] were prepared by changing phenol derivatives of the present invention in the following Solution [α]. The aforementioned aluminum plates were coated with the resultant solutions and dried for one minute at 100° C. to obtain negative type planographic printing plate materials [α-1] to [α-20]. The amount coated after drying was 1.4 g/m².

| Solution [α] | |
|---|---|
| Cross-linking agent (shown in Table 1) | 0.6 g |
| Binder Polymer (shown in Table 1) | 1.4 g |
| Acid-generating agent (shown in Table 1) | 0.2 g |
| Infrared ray absorbing agent (shown in Table 1) | 0.2 g |
| Coloring agent | 0.04 g |
| (VPB-Naps: manufactured by Hodogaya Kagaku K.K.) | |
| Fluorine-based surfactant | 0.03 g |
| (Megafac F-177 PF, manufactured by Dainippon Ink & Chemicals, Inc.) | |
| Solvent: Methyl ethyl ketone | 1.2 g |
| Solvent: Methyl alcohol | 15.8 g |
| Solvent: 1-Methoxy-2-propanol | 10.0 g |

The phenol derivatives, binder polymers, acid-generating agents and infrared absorbing agents used in Solutions [α-1] to [α-20] are shown in Table 1.

The thus-obtained negative type planographic printing plate materials [α-1] to [α-20] were scanning-exposed to a semiconductor laser that emits infrared rays having wavelengths of 830 nm to 850 nm. After exposure, the materials were thermally treated for 15 seconds at 110° C. with a panel heater and developed with a developer DP-4 (1:8 water diluted solution) manufactured by Fuji Photo Film Co., Ltd. The amount of energy necessary for the recording was calculated based on line width of the resulting image, laser output, loss in the optical system and scanning speed.

To test storage stability, the plate material before laser irradiation was left under high humidity conditions (75% RH, 45° C.) for 3 days; thereafter, the stored plate material under the high humidity conditions was laser-exposed as described above, and the amount of energy necessary for the recording was calculated, and difference between the energy amounts before and after being left for 3 days was tested. It was evaluated that it is preferable that this difference is substantially 20 mJ/cm², in terms of production and providing excellent storage stability.

For evaluation of printing durability, a printing plate that had been subjected to laser exposure, heater heating, developing and image-formation was heated with a heater at 27° C. for 1 minute, printing was repeated on a printer, and the final number of printed pieces was recorded. Printing durability indexes were represented as relative values, with the number of prints in Comparative Example 1 set to the reference value (100). A value of 180 or more was evaluated as a level having no problem in actual use. Here, the "final number of printed pieces" means the number of pieces printed before the thickness of a photosensitive layer of the printing plate decreases and ink can not be applied in portions, namely, before so-called print lacking occurs.

The results of these tests are shown together in Table 10.

TABLE 10

| No. of Example | Plate material | Cross-linking agent (mixing ratio wt (%)) | Acid-generating agent | Infrared ray absorbing agent | Binder Polymer | The amount of energy necessary for recording (mJ/cm²) | Change in energy amount with time (mJ/cm²) | Printing durability index |
|---|---|---|---|---|---|---|---|---|
| 1 | α-1 | A-1/II-2 = 50/50 | SX-1 | DX-1 | BX-1 | 160 | 10 | 200 |
| 2 | α-2 | B-1/II-2 = 50/50 | SX-1 | DX-1 | BX-1 | 160 | 10 | 200 |
| 3 | α-3 | C-1/II-3 = 50/50 | SX-2 | DX-1 | BX-1 | 165 | 10 | 250 |
| 4 | α-4 | D-1/II-3 = 50/50 | SX-2 | DX-2 | BX-2 | 160 | 15 | 230 |
| 5 | α-5 | E-1/II-4 = 50/50 | SX-2 | DX-2 | BX-2 | 165 | 10 | 200 |
| 6 | α-6 | C-1/II-1 = 30/70 | SX-2 | DX-1 | BX-1 | 170 | 15 | 220 |
| 7 | α-7 | C-1/II-1 = 40/60 | SX-2 | DX-1 | BX-1 | 165 | 15 | 210 |
| 8 | α-8 | C-1/II-1 = 50/50 | SX-2 | DX-1 | BX-1 | 165 | 10 | 200 |
| 9 | α-9 | C-1/II-1 = 60/40 | SX-2 | DX-1 | BX-1 | 165 | 10 | 200 |
| 10 | α-10 | C-1/II-1 = 70/30 | SX-2 | DX-1 | BX-1 | 160 | 10 | 190 |
| 11 | α-11 | A-1/resol resin = 50/50 | SX-1 | DX-1 | BX-1 | 170 | 15 | 200 |
| 12 | α-12 | B-1/resol resin = 50/50 | SX-1 | DX-1 | BX-1 | 170 | 10 | 230 |
| 13 | α-13 | C-1/resol resin = 50/50 | SX-1 | DX-2 | BX-1 | 165 | 15 | 200 |
| 14 | α-14 | D-1/resol resin = 50/50 | SX-2 | DX-2 | BX-2 | 165 | 15 | 220 |
| 15 | α-15 | E-1/resol resin = 50/50 | SX-2 | DX-2 | BX-2 | 165 | 15 | 190 |
| 16 | α-16 | B-1/resol resin = 30/70 | SX-1 | DX-1 | BX-2 | 175 | 15 | 230 |
| 17 | α-17 | B-1/resol resin = 40/60 | SX-1 | DX-1 | BX-2 | 170 | 15 | 220 |
| 18 | α-18 | B-1/resol resin = 50/50 | SX-1 | DX-1 | BX-2 | 165 | 10 | 220 |
| 19 | α-19 | B-1/resol resin = 60/40 | SX-1 | DX-1 | BX-2 | 165 | 10 | 200 |

TABLE 10-continued

| No. of Example | Plate material | Cross-linking agent (mixing ratio wt (%)) | Acid-generating agent | Infrared ray absorbing agent | Binder Polymer | The amount of energy necessary for recording (mJ/cm$^2$) | Change in energy amount with time (mJ/cm$^2$) | Printing durability index |
|---|---|---|---|---|---|---|---|---|
| 20 | α-20 | B-1/resol resin = 70/30 | SX-1 | DX-1 | BX-2 | 160 | 10 | 190 |

The structures of the acid-generating agents and infrared ray absorbing agents are shown below.

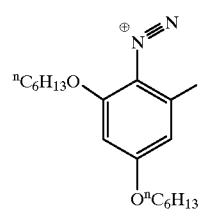

SX-1

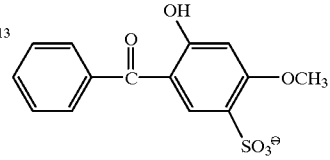

SX-2

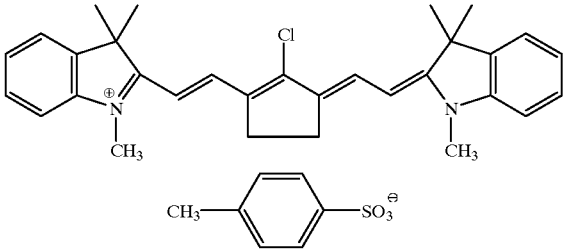

DX-1

DX-2

As is apparent from Table 10, any of the planographic printing plate materials of the present invention could conduct recording with an amount of energy of 200 mJ/cm$^2$ or less, had high sensitivity, and had high printing durability. The storage stability under high humidity conditions was also excellent.

Comparative Examples 1 to 8

Solutions [β-1] to [β-8] were prepared by using single compound cross-linking agents shown in the following Table 2 instead of the cross-linking components containing phenol derivatives of the present invention in Solution [α] used in Examples 1 to 20. The undercoated aluminum plates used in Examples 1 to 20 were coated with these solutions and dried for one minute at 100° C. to obtain negative type planographic printing plate materials [β-1] to [β-8]. The amount coated was 1.4 g/m$^2$ after being dried.

Sensitivity, storage stability under high humidity conditions, and printing durability of the resulting planographic printing plate materials [β-1] to [β-8] were evaluated under the same conditions as in Examples 1 to 20.

The results of these tests are shown together in Table 11.

TABLE 11

| No. of Comparative Example | Plate material | Cross-linking agent | Acid-generating agent | Infrared ray absorbing agent | Binder Polymer | The amount of energy necessary for recording (mJ/cm$^2$) | Change in energy amount with time (mJ/cm$^2$) | Printing durability index |
|---|---|---|---|---|---|---|---|---|
| 1 | β-1 | A-1 | SX-1 | DX-1 | BX-1 | 160 | 10 | 100 |
| 2 | β-2 | B-1 | SX-1 | DX-1 | BX-1 | 160 | 15 | 110 |
| 3 | β-3 | II-2 | SX-1 | DX-1 | BX-1 | 210 | 40 | 200 |
| 4 | β-4 | II-3 | SX-2 | DX-1 | BX-1 | 210 | 30 | 210 |
| 5 | β-5 | II-4 | SX-2 | DX-2 | BX-2 | 200 | 30 | 190 |
| 6 | β-6 | Resol resin | SX-1 | DX-1 | BX-1 | 180 | 40 | 200 |
| 7 | β-7 | Resol resin | SX-1 | DX-1 | BX-2 | 190 | 40 | 200 |
| 8 | β-8 | Resol resin | SX-2 | DX-2 | BX-2 | 180 | 30 | 220 |

As is apparent from Table 11, the planographic printing plate materials using single cross-linking agents were poor in sensitivity, storage stability under high humidity conditions, or printing durability as compared with the planographic printing plate materials of the present invention, and none of them had both sensitivity and printing durability.

According to the present invention, there can be provided a negative type image recording material that can allow direct plate making from digital data of a computer and the like by recording using a solid-state laser or semiconductor laser emitting infrared rays, and further reveals high sensitivity in recording, excellent storage stability under high humidity conditions, and excellent printing durability.

What is claimed is:

1. A negative type image recording material comprising a compound (A) which is cross-linked with the aid of an acid, a binder polymer (B), a compound (C) which generates an acid upon heating, and an infrared ray absorbing agent (D), wherein the compound (A) which is cross-linked with the aid of an acid is a mixture of a lower molecular weight phenol derivative having a molecular weight of 1,000 or less represented by the following general formula (I) with a polynuclear phenol cross-linking agent having in a molecule 3 or more phenol rings having 2 or 3 hydroxymethyl groups on a ring represented by the following general formula (II) and/or resol resin:

General formula (I)

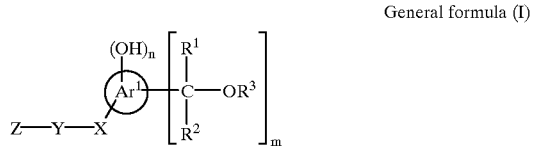

wherein, $Ar^1$ represents an aromatic hydrocarbon ring which may have a substituent; $R^1$ and $R^2$ may be the same or different, and represent a hydrogen atom or a hydrocarbon group having 12 or less carbon atoms; $R^3$ represents a hydrogen atom or a hydrocarbon group having 12 or less carbon atoms; m represents an integer of 2 to 4; n represents an integer of 1 to 3; X represents a divalent connecting group, Y represents a monovalent, divalent, trivalent or tetravalent connecting group having a partial structure selected from the group described below or a functional group having a terminal hydrogen atom, and Z represents a monovalent, divalent, trivalent or tetravalent connecting group or functional group existing in accordance with the number of the connecting group Y and Z does not exist when Y is a terminal group wherein the group of the partial structures is as follows:

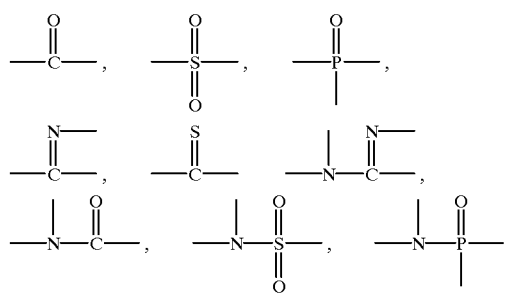

-continued

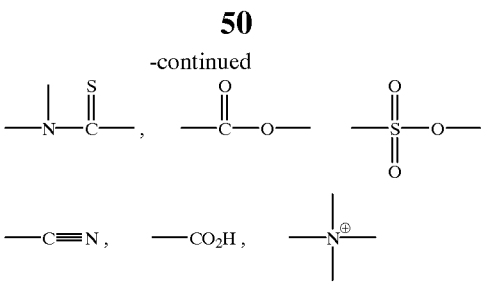

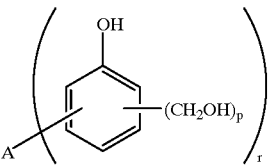

General formula (II)

wherein, A represents an r-valent hydrocarbon connecting group having 1 to 20 carbon atoms; r represents an integer of 3 to 20; and p represents an integer of 2 to 3.

2. A negative type image recording material according to claim 1, wherein the aromatic hydrocarbon ring which may have a substituent represented by $Ar^1$ in the general formula (I) is an aromatic hydrocarbon ring selected from the group consisting of a benzene ring, naphthalene ring and anthracene ring.

3. A negative type image recording material according to claim 2, wherein the substituent of the aromatic hydrocarbon ring represented by $Ar^1$ in the general formula (I) is at least one substituent selected from the group consisting of a halogen atom, an alkoxy group having 12 or less carbon atoms, an alkylthio group having 12 or less carbon atoms, a cyano group, a nitro group and a trifluoromethyl group.

4. A negative type image recording material according to claim 3, wherein the divalent connecting group represented by X in the general formula (I) is a connecting group selected from the group consisting of a normal chain alkylene group having 1 to 18 carbon atoms, a branched alkylene group having 1 to 18 carbon atoms, a cyclic alkylene group having 1 to 18 carbon atoms, a normal chain alkenylene group having 2 to 18 carbon atoms, a branched alkenylene group having 2 to 18 carbon atoms, a cyclic alkenylene group having 2 to 18 carbon atoms, an alkynylene group having 2 to 8 carbon atoms and an arylene group having 6 to 20 carbon atoms.

5. A negative type image recording material according to claim 1, wherein the monovalent, divalent, trivalent or tetravalent connecting group or functional group represented by Z in the general formula (I) is at least one connecting group or functional group selected from the group consisting of a normal chain alkylene group having 1 to 18 carbon atoms, an alkyl group having 1 to 18 carbon atoms, a branched alkylene group having 1 to 18 carbon atoms, a branched alkyl group having 1 to 18 carbon atoms, a cyclic alkylene group having 1 to 18 carbon atoms, a cyclic alkyl group having 1 to 18 carbon atoms, an arylene group having 1 to 18 carbon atoms, an aryl group having 1 to 18 carbon atoms, a normal chain alkenylene group having 2 to 18 carbon atoms, a branched alkenylene group having 2 to 18 carbon atoms, a cyclic alkenylene group having 2 to 18 carbon atoms, an alkenyl group having 2 to 18 carbon atoms, an alkynylene group having 2 to 18 carbon atoms and an alkynyl group having 2 to 18 carbon atoms.

6. A negative type image recording material according to claim 1, wherein the binder polymer of (B) is a polymer having in a main chain or side chain thereof an aromatic hydrocarbon ring to which a hydroxyl group or an alkoxy group is directly bonded.

7. A negative type image recording material according to claim 6, wherein the binder polymer (B) is at least one binder polymer selected from the group consisting of polymers having structural units represented by the following general formula (III), a phenol novolak resin, a halogen-substituted phenol novolak resin, an alkyl-substituted phenol novolak resin, an o-cresol novolak resin, a m-cresol novolak resin and a p-cresol novolak resin:

General formula (III)

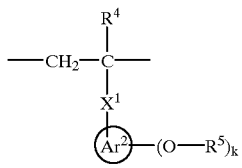

wherein, $Ar^2$ represents a benzene ring, a naphthalene ring or an anthracene ring; $R^4$ represents a hydrogen atom or a methyl group; $R^5$ represents a hydrogen atom or an alkoxy group having 20 or less carbon atoms; $X^1$ represents a single bond or a divalent connecting group containing at least one atom selected from the group consisting of H, N, O and S and having 0 to 20 carbon atoms; and k represents an integer of from 1 to 4.

8. A negative type image recording material according to claim 1, wherein the compound (C) which generates an acid upon heating is at least one onium salt selected from the group consisting of an iodonium salt, a sulfonium salt, a phosphonium salt and a diazonium salt.

9. A negative type image recording material according to claim 1, wherein the infrared ray absorbing agent (D) is a dye which can absorb infrared rays having a wavelength of 760 nm to 1200 nm and is at least one dye selected from the group consisting of an azo dye, a metal complex azo dye, a pyrazolone azo dye, a naphthoquinone dye, an anthraquinone dye, a phthalocyanine dye, a carbonium dye, a quinonimine dye, a methine dye, a cyanine dye, a squarylium dye, a pyrylium salt, and a metal thiolate complex.

10. A negative type image recording material according to claim 1, wherein the infrared ray absorbing agent (D) is a pigment which can absorb infrared ray having a wavelength of 760 nm to 1,200 nm and is a pigment selected from the group consisting of an insoluble azo pigment, an azolake pigment, a phthalocyanine pigment, an anthraquinone pigment, a perylene pigment, a perynone pigment, a thioindigo pigment, a quinacridone pigment, a dioxazine pigment, an isoindolinone pigment, a quinophthalone pigment, a dyeing lake pigment, an azine pigment, a nitroso pigment, a nitro pigment, a natural pigment, a fluorescent pigment, an inorganic pigment, and carbon black.

11. A negative type image recording material according to claim 1, wherein A in the polynuclear phenol cross-linking agent represented by the general formula (II) is a hydrocarbon connecting group having 1 to 20 carbon atoms represented by the following general formulas:

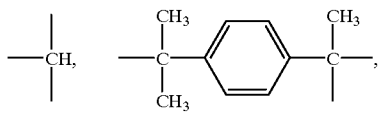

-continued

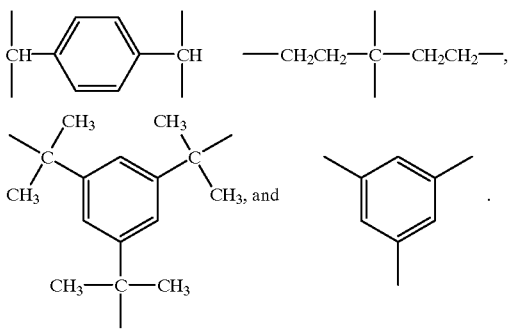

12. A method of plate-making in which a negative type image recording material comprising a substrate carrying thereon a layer comprising a compound (A) which is cross-linked with the aid of an acid, a binder polymer (B), a compound (C) which generates upon heating, and an infrared ray absorbing agent (D) which is irradiated with an infrared laser beam having a wavelength of 760 nm to 1,200 nm to conduct direct plate-making, wherein the compound (A) which is cross-linked with the aid of an acid is a mixture of a lower molecular weight phenol derivative having a molecular weight of 1,000 or less represented by the following general formula (a) with a polynuclear phenol cross-linking agent having in a molecule 3 or more phenol rings having 2 or 3 hydroxymethyl groups on a ring represented by the following general formula (II) and/or resol resin:

General formula (I)

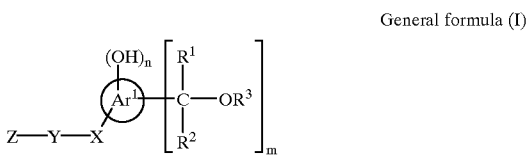

wherein, $Ar^1$ represents an aromatic hydrocarbon ring which may have a substituent; $R^1$ and $R^2$ may be the same or different, and represent a hydrogen atom or a hydrocarbon group having 12 or less carbon atoms; $R^3$ represents a hydrogen atom or a hydrocarbon group having 12 or less carbon atoms; m represents an integer of 2 to 4; n represents an integer of 1 to 3; X represents a divalent connecting group, Y represents a monovalent, divalent, trivalent or tetravalent connecting group partial structure selected from the group described below or a functional group having a terminal hydrogen atom, and Z represents a monovalent, divalent, trivalent or tetravalent connecting group or functional group existing in accordance with the number of the connecting group Y and wherein Z does not exist when Y is a terminal group wherein the group of partial structures is as follows:

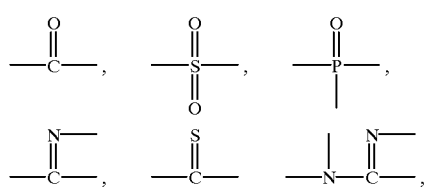

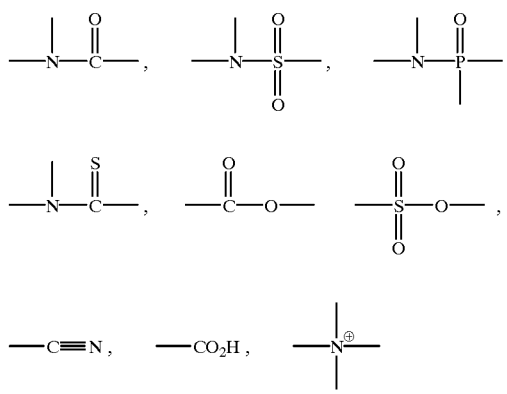

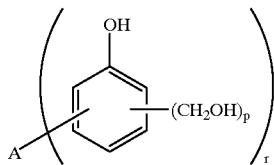

General formula (II)

wherein, A represents an r-valent hydrocarbon connecting group having 1 to 20 carbon atoms; r represents an integer of 3 to 20; and p represents an integer of 2 to 3.

13. A method of plate-making according to claim 12, wherein the aromatic hydrocarbon ring which may have a substituent represented by $Ar^1$ in the general formula (I) is an aromatic hydrocarbon ring selected from the group consisting of a benzene ring, a naphthalene ring and an anthracene ring.

14. A method of plate making according to claim 12, wherein the divalent connecting group represented by X in the general formula (I) is a connecting group selected from the group consisting of a normal chain alkylene group having 1 to 18 carbon atoms, a branched alkylene group having 1 to 18 carbon atoms, a cyclic alkylene group having 1 to 18 carbon atoms, a normal chain alkenylene group having 2 to 18 carbon atoms, a branched alkenylene group having 2 to 18 carbon atoms, a cyclic alkenylene group having 2 to 18 carbon atoms, an alkynylene group having 2 to 8 carbon atoms and an arylene group having 6 to 20 carbon atoms.

15. A method of plate-making according to claim 12, wherein the monovalent, divalent, trivalent or tetravalent connecting group or functional group represented by Z in the general formula (I) is at least one connecting group or functional group selected from the group consisting of a normal chain alkylene group having 1 to 18 carbon atoms, an alkyl group having 1 to 18 carbon atoms, a branched alkylene group having 1 to 18 carbon atoms, a branched alkyl group having 1 to 18 carbon atoms, a cyclic alkylene group having 1 to 18 carbon atoms, a cyclic alkyl group having 1 to 18 carbon atoms, an arylene group having 1 to 18 carbon atoms, an aryl group having 1 to 18 carbon atoms, a normal chain alkenylene group having 2 to 18 carbon atoms, a branched alkenylene group having 2 to 18 carbon atoms, a cyclic alkenylene group having 2 to 18 carbon atoms, an alkenyl group having 2 to 18 carbon atoms, an alkynylene group having 2 to 18 carbon atoms and an alkynyl group having 2 to 18 carbon atoms.

16. A method of plate-making according to claim 12, wherein the binder polymer (B) is at least one binder polymer selected from the group consisting of polymers having structural units represented by the following general formula (III), a phenol novolak resin, a halogen-substituted phenol novolak resin, an alkyl-substituted phenol novolak resin, an o-cresol novolak resin, a m-cresol novolak resin and a p-cresol novolak resin:

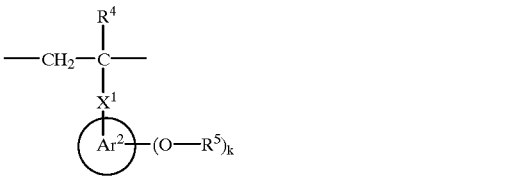

General formula (III)

wherein, $Ar^2$ represents a benzene ring, a naphthalene ring or an anthracene ring; $R^4$ represents a hydrogen atom or a methyl group; $R^5$ represents a hydrogen atom or an alkoxy group having 20 or less carbon atoms; $X^1$ represents a single bond or a divalent connecting group containing at least one atom selected from the group consisting of H, N, O and S and having 0 to 20 carbon atoms; and k represents an integer of from 1 to 4.

17. A method of plate making according to claim 12, wherein the compound (C) which generates an acid upon heating is at least one onium salt selected from the group consisting of an iodonium salt, a sulfonium salt, a phosphonium salt and a diazonium salt.

18. A method of plate-making according to claim 12, wherein the infrared absorbing agent (D) is at least one dye selected from the group consisting of an azo dye, a metal complex azo dye, a pyrazolone azo dye, a naphthoquinone dye, an anthraquinone dye, a phthalocyanine dye, a carbonium dye, a quinonimine dye, a methine dye, a cyanine dye, a squarylium dye, a pyrylium salt, and a metal thiolate complex.

19. A method of plate making according to claim 12, wherein the infrared absorbing agent (D) is a pigment selected from the group consisting of an insoluble azo pigment, anazolake pigment, a phthalocyanine pigment, an anthraquinone pigment, a perylene pigment, a perynone pigment, a thioindigo pigment, a quinacridone pigment, a dioxazine pigment, an isoindolinone pigment, a quinophthalone pigment, a dyeing lake pigment, an azine pigment, a nitroso pigment, a nitro pigment, a natural pigment, a fluorescent pigment, an inorganic pigment, and carbon black.

20. A method of plate making according to claim 12, wherein A in the polynuclear phenol cross-linking agent represented by the general formula (II) is a hydrocarbon connecting group having 1 to 20 carbon atoms represented by the following general formula:

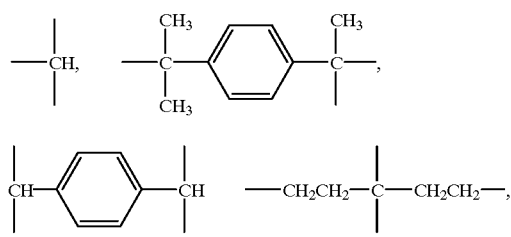
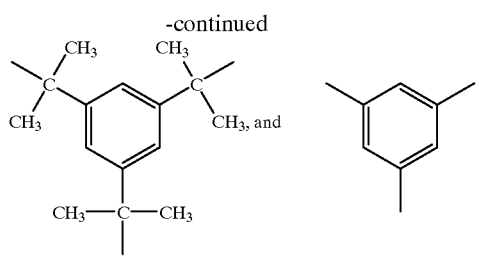
-continued
* * * * *